(12) United States Patent
Wang

(10) Patent No.: US 11,984,052 B2
(45) Date of Patent: May 14, 2024

(54) DISPLAY DEVICE AND MANUFACTURING METHOD THEREOF

(71) Applicants: BOE MLED TECHNOLOGY CO., LTD., Beijing (CN); BOE TECHNOLOGY GROUP CO., LTD., Beijing (CN)

(72) Inventor: Shipeng Wang, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 560 days.

(21) Appl. No.: 17/279,677

(22) PCT Filed: May 28, 2020

(86) PCT No.: PCT/CN2020/092804
§ 371 (c)(1),
(2) Date: Mar. 25, 2021

(87) PCT Pub. No.: WO2021/237551
PCT Pub. Date: Dec. 2, 2021

(65) Prior Publication Data
US 2022/0198969 A1 Jun. 23, 2022

(51) Int. Cl.
*G09F 9/30* (2006.01)
*G09F 9/302* (2006.01)
(Continued)

(52) U.S. Cl.
CPC .............. *G09F 9/3026* (2013.01); *G09F 9/33* (2013.01); *H01L 27/156* (2013.01)

(58) Field of Classification Search
CPC ....... G09F 9/3026; G09F 9/33; H01L 27/156; H01L 25/0753; H01L 25/167; G09G 2300/026; G09G 2300/04; G09G 3/32
See application file for complete search history.

(56) References Cited

U.S. PATENT DOCUMENTS 10,546,516 B2 * 1/2020 Tomoda ............... G09G 3/3208
2013/0279012 A1 * 10/2013 Lee ........................ G09F 13/04
359/622
(Continued)

FOREIGN PATENT DOCUMENTS

CN 204946486 U * 1/2016
CN 204946486 U 1/2016
(Continued)

*Primary Examiner* — S M Sohel Imtiaz
(74) *Attorney, Agent, or Firm* — HOUTTEMAN LAW LLC

(57) ABSTRACT

A display device of embodiments of the present disclosure includes: a plurality of display panels each having a display side and a back side opposite to each other; a positioning substrate facing the back side of the display panel; and a plurality of connection structures, each of the plurality of display panels corresponding to at least one connection structure and being fixed on the positioning substrate by bonding through its corresponding connection structure(s); wherein each connection structure includes: a fixing member connected to the back side of the display panel; a first connection member detachably connected to the fixing member; and a second connection member detachably connected to the positioning substrate, and configured to be bonded to the first connection member through a first bonding structure, so that the display panel is fixed on the positioning substrate by bonding.

16 Claims, 12 Drawing Sheets

(51) Int. Cl.
    *G09F 9/33*     (2006.01)
    *H01L 27/15*     (2006.01)

(56)     References Cited

U.S. PATENT DOCUMENTS

| | | | |
|---|---|---|---|
| 2014/0062836 A1* | 3/2014 | Hyman | G09F 9/3026 |
| | | | 345/1.3 |
| 2016/0014882 A1* | 1/2016 | Jongman | G02F 1/13452 |
| | | | 156/247 |
| 2017/0011669 A1* | 1/2017 | Meersman | G09F 9/3026 |
| 2017/0116895 A1* | 4/2017 | Declerck | G09F 9/3026 |
| 2019/0012955 A1* | 1/2019 | Xu | G09F 9/33 |
| 2019/0289729 A1* | 9/2019 | Nguyen | H05K 5/0017 |
| 2020/0163246 A1* | 5/2020 | Yueh | H05K 7/1451 |
| 2021/0165470 A1* | 6/2021 | Brooks | H05K 7/20963 |
| 2021/0358347 A1* | 11/2021 | Jiang | G09F 9/3026 |

FOREIGN PATENT DOCUMENTS

| | | | | |
|---|---|---|---|---|
| CN | 107978235 A | | 5/2018 | |
| CN | 108986679 A | | 12/2018 | |
| CN | 111048001 A | * | 4/2020 | ............ G09F 9/302 |
| CN | 111048001 A | | 4/2020 | |
| KR | 101901213 B1 | * | 9/2018 | |
| WO | WO 2019099985 A1 | | 5/2019 | |

\* cited by examiner

DISPLAY DEVICE AND MANUFACTURING METHOD THEREOF

TECHNICAL FIELD

The present disclosure relates to the field of splicing display technology, and in particular, relates to a display device and a manufacturing method thereof.

BACKGROUND

Light-emitting diode (LED) display technology has attracted more and more attention due to its advantages such as high dynamic contrast and high brightness. Due to the limited size of a single LED display panel, in many application scenarios, it is necessary to splice a plurality of LED display panels into a display device. An available display device includes a box body having a plurality of clamping portions, to each of which one light-emitting diode display panel is connected. If necessary, a plurality of box bodies may be spliced together to form a larger display system.

However, a mechanical clamping structure has a limited dimensional accuracy, which causes problems such as uneven gaps between different display panels and unaligned marginal pixels in the display device, thereby affecting the display effect. This problem of insufficient splicing accuracy becomes more obvious especially as the pixel size (pitch) continues to decrease.

SUMMARY

Embodiments of the present disclosure provide a display device which has high positioning accuracy and good display effect and a manufacturing method thereof.

In a first aspect, the embodiments of the present disclosure provide a display device, including:
- a plurality of display panels each having a display side and a back side opposite to each other;
- a positioning substrate arranged facing the back side of the display panel;
- a plurality of connection structures, each of the plurality of display panels corresponding to at least one connection structure and being fixed on the positioning substrate by bonding through the at least one connection structure corresponding thereto;
- wherein each of the plurality of connection structures includes:
- a fixing member connected to the back side of the display panel;
- a first connection member detachably connected to the fixing member; and
- a second connection member detachably connected to the positioning substrate, and configured to be bonded to the first connection member through a first bonding structure, so that the display panel is fixed on the positioning substrate by bonding.

In some embodiments, the first connection member has a bonding portion extending in a direction perpendicular to the display panel;
the second connection member has a bonding hole extending in the direction perpendicular to the display panel; and
at least a part of the bonding portion is inserted into the bonding hole, an outer surface of the bonding portion inserted into the bonding hole is bonded to an inner surface of the bonding hole through the first bonding structure; and when the bonding portion is inserted to a central position of the bonding hole, there is a gap between the outer surface of the bonding portion and the inner surface of the bonding hole.

In some embodiments, the bonding hole is a through hole penetrating through the second connection member;
the second connection member is detachably inserted in a positioning hole penetrating through the positioning substrate;
the first connection member has a connection hole extending in the direction perpendicular to the display panel, and the connection hole penetrates through the first connection member; and
the fixing member includes an insertion portion extending in the direction perpendicular to the display panel, and a part of the insertion portion is inserted into the connection hole and is detachably connected to the first connection member.

In some embodiments, the insertion portion is a stud with an external thread;
an inner surface of the connection hole of the first connection member has an internal thread matching the external thread, and the first connection member is threadedly connected with the insertion portion.

In some embodiments, the second connection member is clamped in the positioning hole of the positioning substrate.

In some embodiments, the first connection member further includes a limiting portion connected to an end of the bonding portion close to the display panel; and
in a plane parallel to the display panel, a dimension of an outer edge of the limiting portion in at least one direction is larger than a diameter of the bonding hole in this direction, so as to prevent the limiting portion from entering the bonding hole.

In some embodiments, the first connection member and the second connection member are made of a plastic material.

In some embodiments, the fixing member is bonded to the back side of the display panel.

In some embodiments, each display panel corresponds to at least three connection structures, and positions of at least three of the at least three connection structures on the back side of the display panel are not collinear.

In some embodiments, a driving circuit configured to provide a driving signal to the display panel is connected to the positioning substrate, and the driving circuit is electrically connected to the display panel.

In some embodiments, the driving circuit is connected to a side of the positioning substrate facing the display panel; or,
the driving circuit is connected to a side of the positioning substrate away from the display panel.

In some embodiments, the display device further includes a fine adjustment structure between the display panel and the positioning substrate, and the fine adjustment structure includes:
- a fine adjustment platform connected to the back side of the display panel; and
- a fine adjustment bracket connected to a side of the fine adjustment platform away from the display panel, the fine adjustment bracket being movable relative to the positioning substrate in a plane parallel to the positioning substrate.

In some embodiments, the display panel is a light-emitting diode display panel; and
the light-emitting diode display panel includes a substrate and a plurality of light-emitting diodes connected to the substrate.

In some embodiments, the light-emitting diode is a Micro-LED or a Mini-LED.

In a second aspect, embodiments of the present disclosure provide a manufacturing method of a display device, which includes:

providing a positioning substrate and a plurality of display panels; each of the plurality of display panels having a display side and a back side opposite to each other, and the back side being connected to a fixing member of at least one connection structure;

detachably connecting a first connection member of the connection structure to the fixing member, and detachably connecting a second connection member of the connection structure to the positioning substrate;

arranging the plurality of display panels at predetermined positions; and forming a first bonding structure between the first connection member and the second connection member to bond the first connection member with the second connection member, so that the display panel is fixed on the positioning substrate by bonding; the positioning substrate being arranged to face the back side of the display panel.

In some embodiments, arranging the plurality of display panels at predetermined positions includes:

acquiring a current image including the plurality of display panels, analyzing the current image to determine a current position of each display panel, and adjusting a position of the display panel according to a difference between the current position and the predetermined position of the display panel.

BRIEF DESCRIPTION OF THE DRAWINGS

The accompanying drawings are used to provide a further understanding of embodiments of the present disclosure, constitute a part of the specification, and are used to explain the present disclosure together with the embodiments of the present disclosure, instead of limiting the present disclosure. The above and other features and advantages will become more apparent to those of ordinary skill in the art by describing the detailed exemplary embodiments with reference to the accompanying drawings. In the accompanying drawings.

Figure 1:
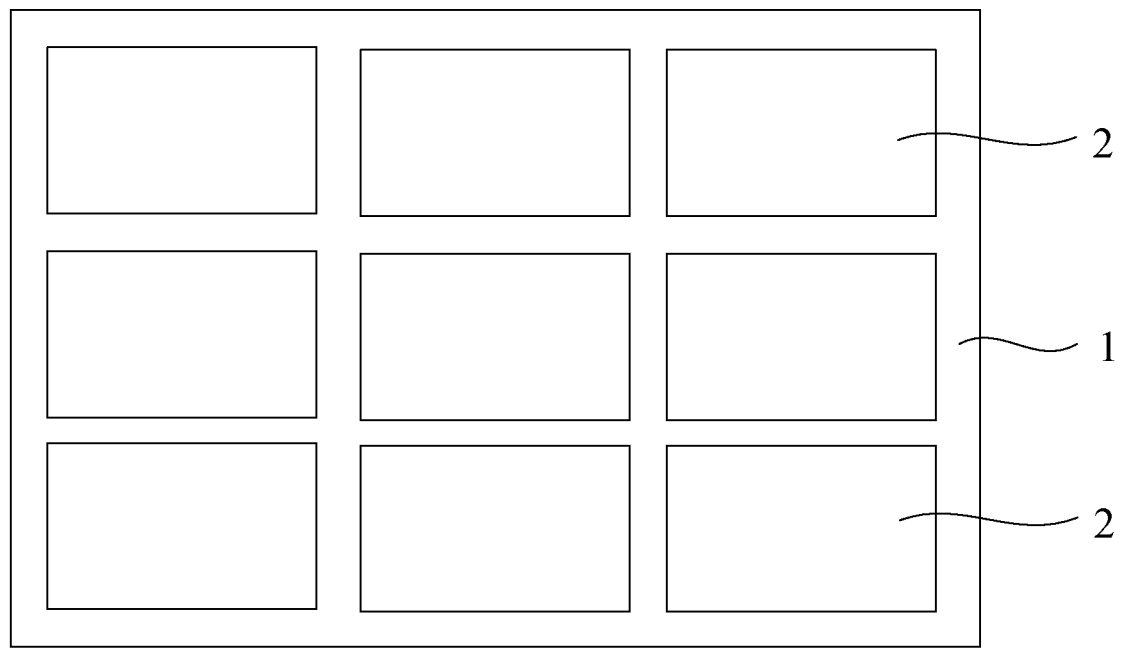
FIG. 1 is a schematic top view of a structure of a display device according to an embodiment of the disclosure.

REFERENCE NUMERALS 1. positioning substrate; 11. positioning hole; 2. display panel; 3. driving circuit; 31. connection board; 32. additional components; 33. external flexible circuit board; 41. panel circuit board; 42. panel flexible circuit board; 51. fine adjustment platform; 52. fine adjustment bracket; 81. first bonding structure; 82. additional bonding structure; 83. second bonding structure; 89. positioning pin; 9. connection structure; 90. fixing member; 901. insertion portion; 902. base portion; 91. first connection member; 911. bonding portion; 912. limiting portion; 919. connection hole; 92. second connection member; 921. bonding hole.

DETAILED DESCRIPTION

In order to enable those of ordinary skill in the art to better understand the technical solutions of embodiments of the present disclosure, the display device and the manufacturing method thereof provided by the embodiments of the present disclosure will be described in detail below with reference to the accompanying drawings.

Hereinafter, the embodiments of the present disclosure will be described more fully with reference to the accompanying drawings, but the illustrated embodiments may be embodied in different forms and should not be construed as being limited to the embodiments set forth in the present disclosure. Rather, the purpose of providing these embodiments is to make the present disclosure thorough and complete, and to enable those of ordinary skill in the art to fully understand the scope of the present disclosure.

The embodiments of the present disclosure may be described with reference to plan views and/or cross-sectional views with the aid of ideal schematic diagrams of the present disclosure. Therefore, the exemplary illustrations may be modified according to manufacturing technology and/or tolerances.

The embodiments and the features in the embodiments of the present disclosure may be combined with each other without conflict.

The terms used in the present disclosure are only used to describe specific embodiments, and are not intended to limit the present disclosure. For example, the term "and/or" as used in the present disclosure includes any and all combinations of one or more related listed items. The singular forms "a" and "the" as used in the present disclosure are also intended to include plural forms, unless the context clearly indicates otherwise. As used in the present disclosure, the terms "including" and "comprising" specify the presence of the described features, integers, steps, operations, elements and/or components, but do not preclude the presence or addition of one or more other features, integers, steps, operations, elements, components and/or groups thereof.

Unless otherwise defined, the meanings of all terms (including technical and scientific terms) used in the present disclosure are the same as those commonly understood by those of ordinary skill in the art. It will be further understood that terms, such as those defined in commonly used dictionaries, should be interpreted as having meanings that are consistent with their meanings in the context of the relevant art and the present disclosure and will not be interpreted in an idealized or overly formal sense unless expressly so defined herein.

Embodiments of the present disclosure are not limited to the embodiments shown in the drawings, but include modifications in configurations formed on the basis of manufacturing processes. Therefore, regions exemplified in the figures have schematic properties, and shapes of the regions shown in the figures exemplify specific shapes of the regions of the elements, but are not constructed as limitations.

In a first aspect, referring to FIGS. 1 to 18, embodiments of the present disclosure provide a display device, which includes:
- a plurality of display panels 2; each display panel 2 has a display side and a back side opposite to each other;
- a positioning substrate 1 on the back side of the display panel 2;
- a plurality of connection structures 9, each display panel 2 corresponding to at least one connection structure 9, and the display panel 2 being fixed on the positioning substrate 1 by bonding through its corresponding connection structure(s) 9;

wherein each connection structure 9 includes:
- a fixing member 90 connected to the back side of the display panel 2;
- a first connection member 91 detachably connected to the fixing member 90; and
- a second connection member 92 detachably connected to the positioning substrate 1 and bonded to the first connection member 91 through a first bonding structure 81, so that the display panel 2 is fixed on the positioning substrate 1 by bonding.

Figure 2:
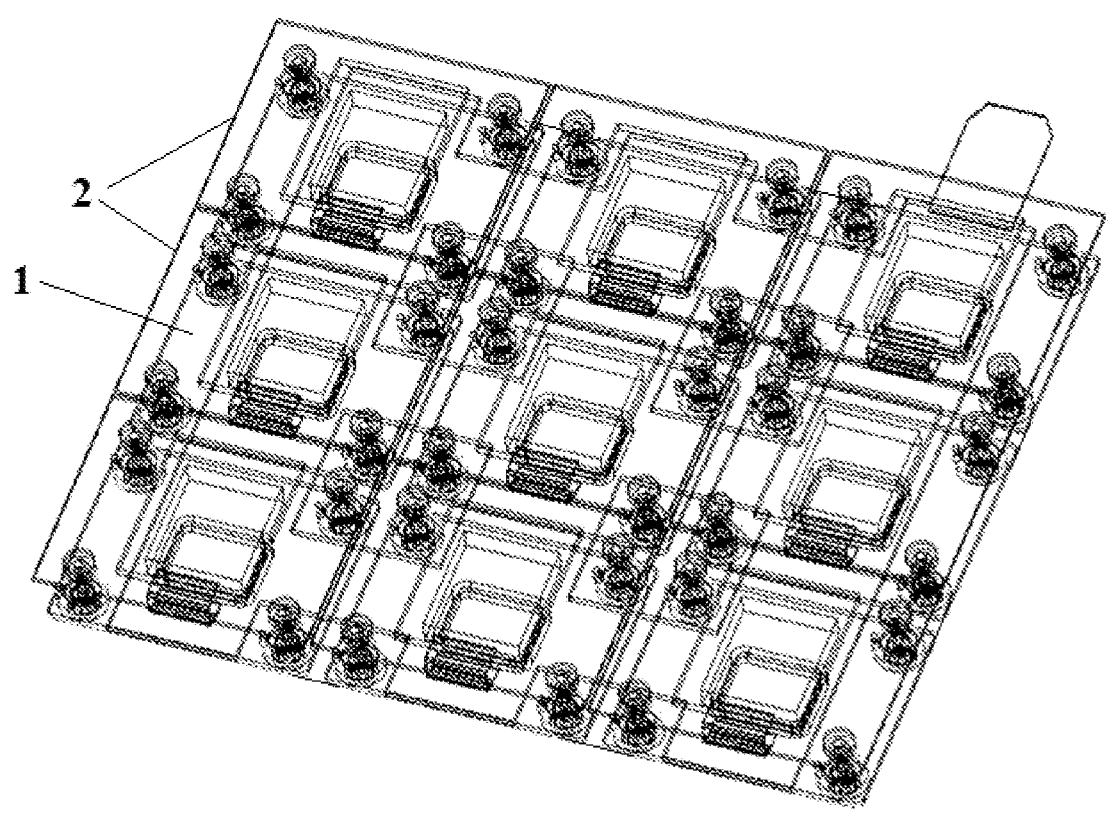
FIG. 2 is a schematic perspective view of a structure of a display device according to an embodiment of the disclosure.
Figure 3:
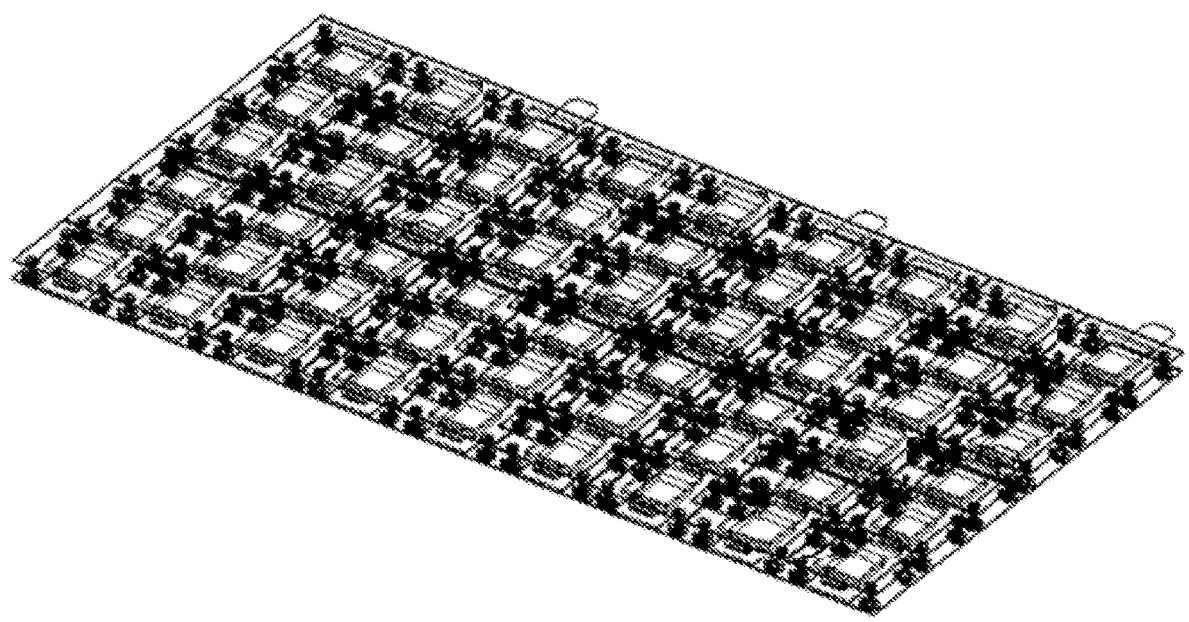
FIG. 3 is a schematic perspective view of a structure of a display system composed of a plurality of display devices according to an embodiment of the disclosure.

Referring to FIGS. 1 and 2, the display device of the embodiments of the present disclosure is formed by assembling a positioning substrate 1 and a plurality of display panels 2. The plurality of display panels 2 are disposed at different positions on a same side of the positioning substrate 1, and display sides of the display panels 2 face outward (i.e., toward a side away from the positioning substrate 1).

As such, the display device of the embodiments of the present disclosure actually has a plurality of display panels 2 spliced together at specific positions, and thus is a "splicing display device (splicing screen)". Therefore, the plurality of display panels 2 in the display device of the embodiments of the present disclosure can display a required picture together, that is, each display panel 2 displays a part of the picture.

It should be understood that due to limitation of the area, the maximum number of display panels 2 that can be connected to each positioning substrate 1 is limited (e.g., referring to FIGS. 1 and 2, each positioning substrate 1 can connect up to nine display panels 2). However, in an actual display device, the number of display panels 2 connected to the positioning substrate 1 may be less than (of course, may also be equal to) the maximum number, that is, the display panels 2 do not necessarily occupy the entire positioning substrate 1.

Of course, if a screen having a larger area is required, a plurality of display devices may be further spliced together (i.e., the positioning substrates 1 are spliced) to obtain a larger display system. For example, referring to FIG. 3, six display devices may be spliced into a larger display system.

Each display panel 2 is a display screen that can display independently, and has a display side (i.e., a user views the display panel 2 from this side) and a back side (i.e., the "back" of the display panel 2) that are opposite to each other.

In some embodiments, the display panel 2 is a light-emitting diode display panel; the light-emitting diode display panel includes a substrate and a plurality of light-emitting diodes connected to the substrate.

As an implementation of the embodiments of the present disclosure, the display panel 2 may be a light-emitting diode display panel (or called an LED single-chip lamp panel) using a light-emitting diode (LED) device as a light-emitting unit. The LED display panel includes a substrate (glass substrate or circuit board substrate) that carries other devices. The substrate may be provided thereon with circuits such as gate lines, data lines, transistors, etc., and has a plurality of connection terminals (pads) connected to the circuits. Furthermore, a plurality of light-emitting diode devices (such as LED chips) arranged in an array may be bonded to (or disposed by surface mounting technology on) the display side of the substrate such that cathodes and anodes of the light-emitting diode devices are respectively electrically connected to the corresponding connection terminals, so as to obtain a light-emitting diode display panel. Each light-emitting diode device, as one pixel or sub-pixel of the light-emitting diode display panel, emits light independently.

For example, light-emitting colors of the light-emitting diode devices may be red, green, and blue, and three light-emitting diode devices with different light-emitting colors constitute one pixel.

Surface mounting technology refers to technology of connecting a light-emitting diode device (chip) to the display side of the substrate and meanwhile electrically connecting the cathode and the anode of the light-emitting diode device to the corresponding connection terminals on the substrate respectively.

For example, as a specific connecting manner, the cathode and the anode of the light-emitting diode device may be bonded to the corresponding connection terminals respectively through a conductive adhesive, so as to realize physical connection and electrical connection at the same time.

Alternatively, it may also be possible to provide a conductive microtubule with an opening at the upper end (the end distal to the connection terminal) on the connection terminal, and the conductive microtubule is "pierced" into the cathode or the anode (e.g., made of aluminum material) of the light-emitting diode device to achieve physical connection and electrical connection.

Of course, the display panel 2 may also include other devices, such as a black matrix (BM) filled between different light-emitting diode devices to avoid color mixing, a counter substrate (cover plate) assembled with the above substrate to encapsulate the light-emitting diode devices, and the like, which are not described in detail here.

In some embodiments, the light-emitting diode is a Micro-LED or a Mini-LED.

In other words, the light-emitting diode device in the light-emitting diode display panel may be a light-emitting diode having a relatively small size, such as a Micro-LED or a Mini-LED.

An orthographic projection of the light-emitting diode on the substrate is usually in the shape of an approximate rectangle, and a plurality of adjacent rectangles (e.g., the rectangles of red, green, and blue light-emitting diodes) may constitute a rectangle formed by an orthographic projection of one pixel, and the dimension of the longer side of the rectangle of the pixel may represent the pixel size.

Generally, the pixel size corresponding to a Micro-LED or a Mini-LED may be smaller (as compared to a conventional light-emitting diode), and may be, for example, smaller than 1.2 mm, and even smaller than 0.5 mm.

Obviously, as the size of the pixel decreases, the influence of the deviation of the pixel position on the display will become more and more obvious.

For example, when the pixel size is 1.5 mm, the impact caused by the pixel position deviation of 0.1 mm may be relatively insignificant; when the pixel size is 0.4 mm, the pixel position deviation of 0.1 mm is equivalent to ¼ of the pixel size, and a visible impact is caused. Therefore, the embodiments of the present disclosure are particularly suitable for Micro-LEDs or Mini-LEDs, especially Mini-LEDs.

In some embodiments, other auxiliary structures may be added to the display panel 2 of the embodiments of the present disclosure.

Figure 7:
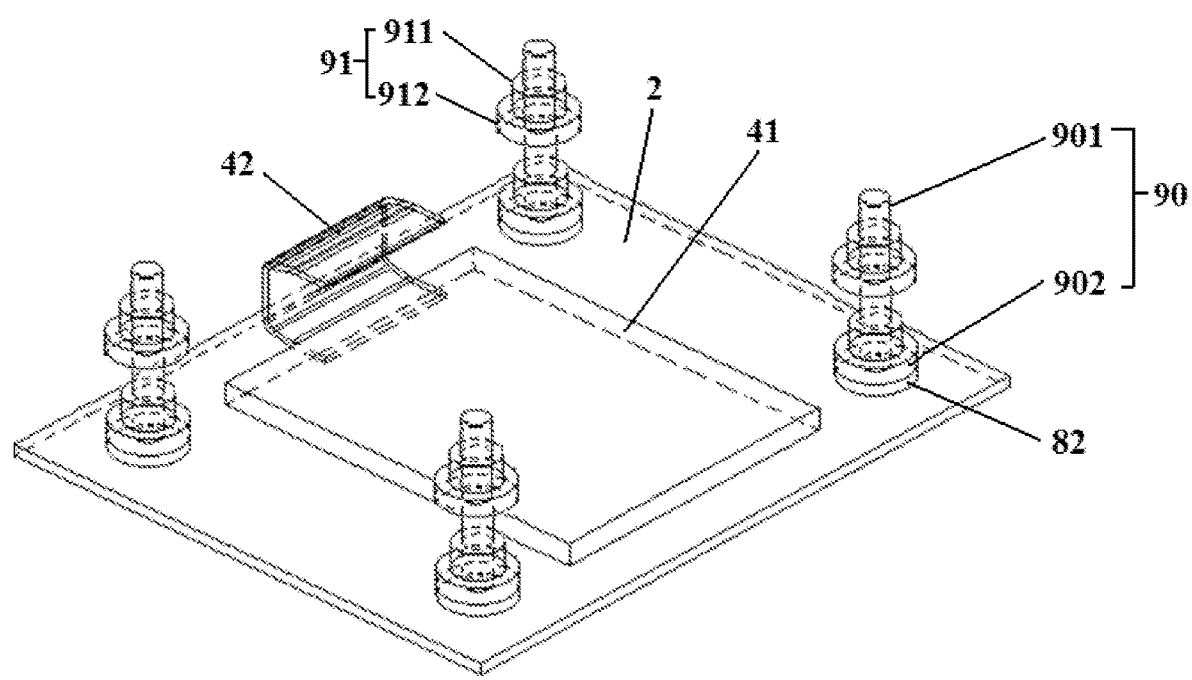
FIG. 7 is a schematic diagram of a structure of a display panel assembly (in the absence of a second connection member) according to an embodiment of the disclosure.
Figure 8:
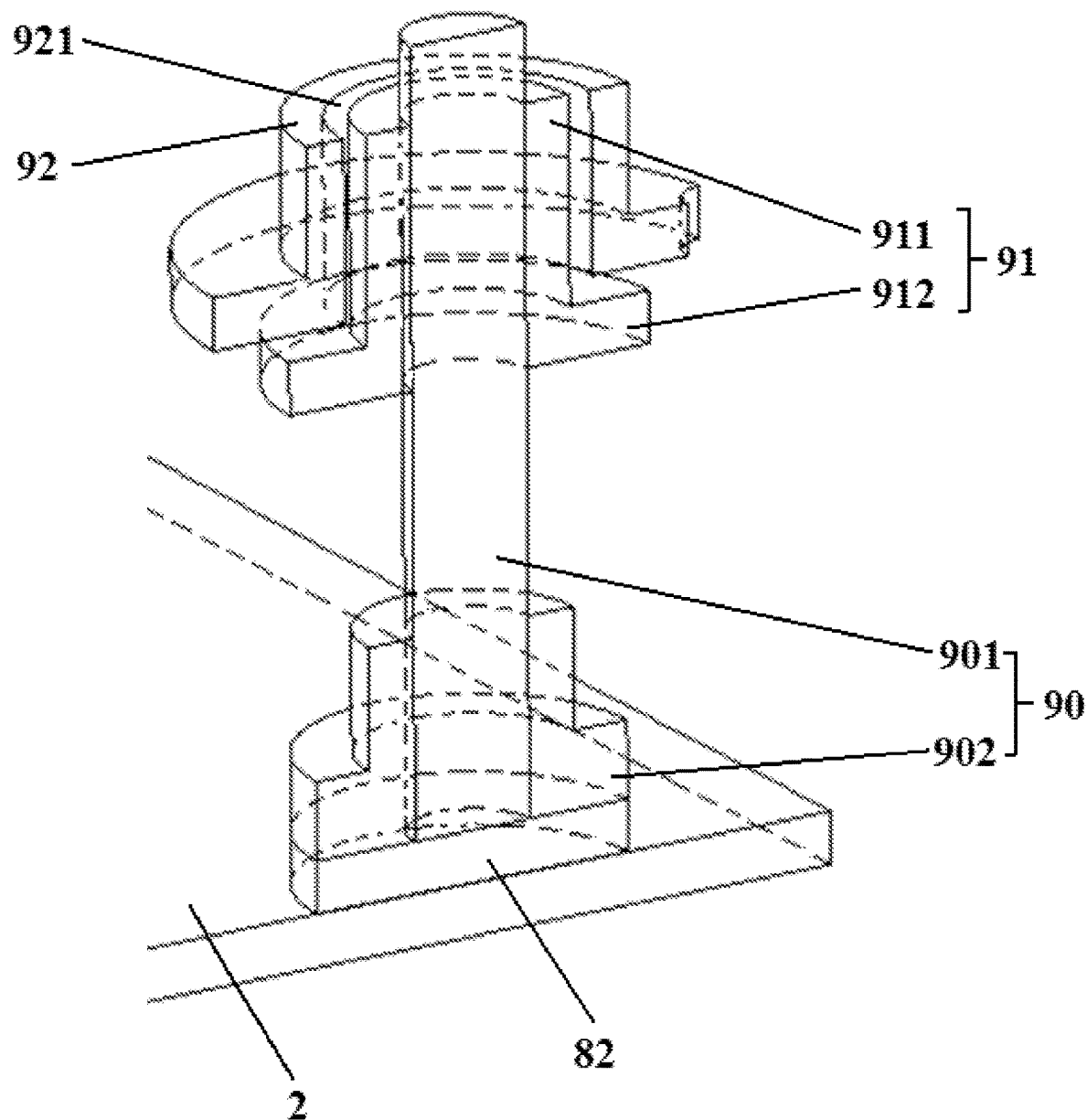
FIG. 8 is a schematic partial cross-sectional view of a structure of a connection structure of a display panel assembly according to an embodiment of the disclosure.

For example, referring to FIG. 7, the back side of each display panel 2 may be connected to a panel circuit board 41 (panel PCB), and one side of the panel circuit board 41 is connected to a panel flexible circuit board 42 (panel-HUB FPC). The panel flexible circuit board 42 is configured to connect to a connection board 31 (Hub) to provide driving signals required for display to the display panel 2, so as to drive the display panel 2 to display.

The panel circuit board 41 and the display panel 2 may be connected in various ways. For example, the panel circuit board 41 and the display panel 2 may be directly formed as a one-piece structure, or the panel circuit board 41 may be connected to the display panel 2 by snap-fit, bonding, or the like when needed.

The positioning substrate 1 of the embodiments of the present disclosure is a base for fixing a plurality of display panels 2 by bonding.

Figure 4:
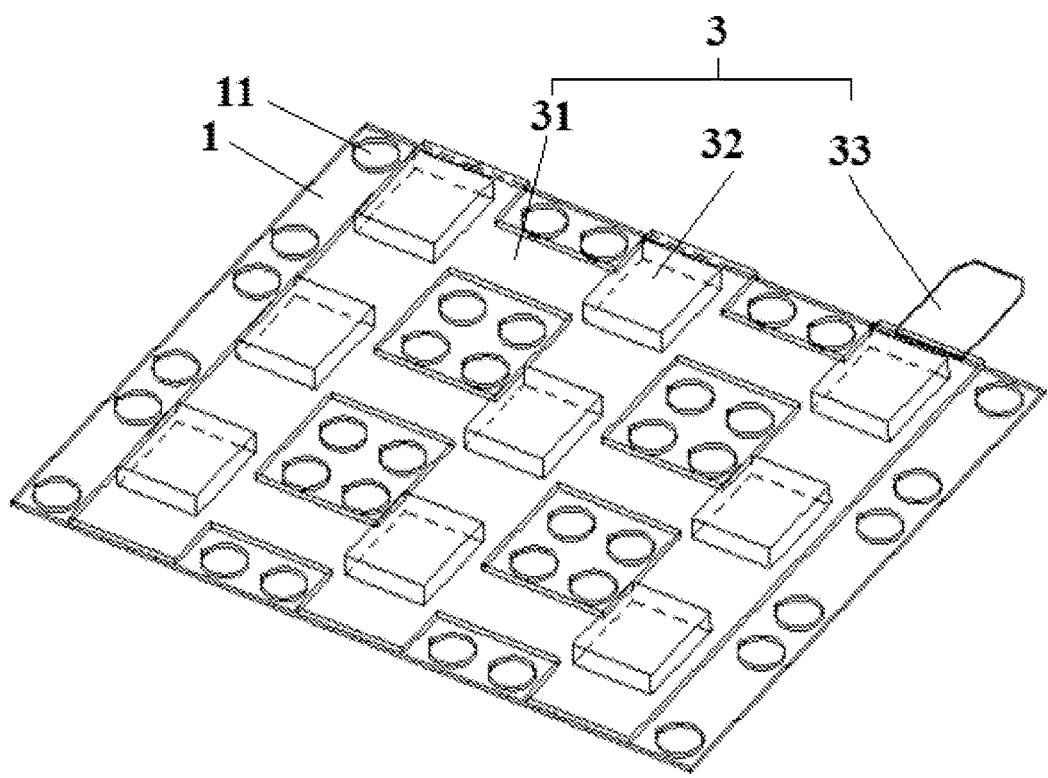
FIG. 4 is a schematic diagram of a structure of a positioning substrate of a display device according to an embodiment of the disclosure.

Referring to FIG. 4, the positioning substrate 1 has a plate shape as a whole, and one side of the positioning substrate 1 is configured to be connected to the display panel(s) 2.

Referring to FIGS. 1 and 2, a plurality of display panels 2 may be fixed at different positions on a same side of the positioning substrate 1 by bonding, with their back sides facing the positioning substrate 1. Thus, the plurality of display panels 2 are considered to be "spliced" together at specific positions to form the display device of the embodiments of the present disclosure.

It should be understood that each of the positioning substrate 1 and the display panel 2 has a plate-shaped structure as a whole, and the plate-shaped structure as a whole has two main surfaces that are substantially planar. Therefore, a direction parallel/perpendicular to the positioning substrate 1/the display panel 2 described in the embodiments of the present disclosure refers to a direction parallel/perpendicular to the main surfaces of the positioning substrate 1/the display panel 2 as a whole.

It should be understood that generally the positioning substrate 1 and the display panel 2 should also be parallel to each other, that is, the direction parallel/perpendicular to the positioning substrate 1 is the direction parallel/perpendicular to the display panel 2.

The material and size of the positioning substrate 1 may be determined according to the number of display panels 2 that need to be fixed. For example, when the overall size of the positioning substrate 1 is large, the positioning substrate 1 may be made of a material with relatively high strength, such as steel; and when the overall size of the positioning substrate 1 is small, the positioning substrate 1 may be made of a relatively low-cost material, such as plastics (e.g., engineering plastics).

In some related art, the display panels are spliced by snap-fit. For example, a "box body" may be provided in advance. Each box body has a plurality of clamping portions, to each of which one display panel is connected by snap-fit, or the display panel may be further fixed by a screw, magnetic attraction, etc.

It can be seen that, according to the related art, each display panel 2 must be located at a position of the clamping portion, and the position cannot be adjusted. However, in the meanwhile, due to the limited dimensional accuracy (e.g., determined by processing accuracy) of the mechanical clamping structure, the actual position (especially the position in a plane parallel to the display panel) of each display panel in the display device is not accurate, which, in turn, causes problems such as uneven gaps between display panels and unaligned marginal pixel positions due to deviation, thereby significantly affecting the display effect.

Especially, with the application of Micro-LEDs and Mini-LEDs, the pixel size becomes smaller and smaller, and the above position accuracy has more and more obvious influence on the display effect.

In an embodiment of the present disclosure, the display panel 2 is connected to the positioning substrate 1 by bonding. Therefore, each display panel 2 can be accurately adjusted to the desired position and then bonded to the positioning substrate 1, that is, bonding allows position adjustment within a certain range.

Therefore, in the display device of the embodiments of the present disclosure, the positioning accuracy of the display panel 2 is high. For example, in some embodiments, the position error of the display panel 2 in a plane parallel to the positioning substrate 1 can be controlled to be smaller than 0.01 mm, so that the gaps between the display panels are uniform, the marginal pixel positions are accurate, and the display effect is improved.

Furthermore, even for a display panel 2 with a small pixel size (e.g., an LED display panel using Micro-LEDs and Mini-LEDs), the display device of the embodiments of the present disclosure can ensure the accurate positions of the pixels in the display panel 2 to improve the display effect.

In addition, the display device of the embodiments of the present disclosure has low production cost and easy layout, which facilitates rapid deployment of a production line and mass production, and also facilitates internal wiring and modular expansion of the display device.

In some embodiments, the positioning substrate 1 is connected to a driving circuit 3 configured to provide driving signals to the display panel 2, and the driving circuit 3 is electrically connected to the display panel 2.

Figure 5:
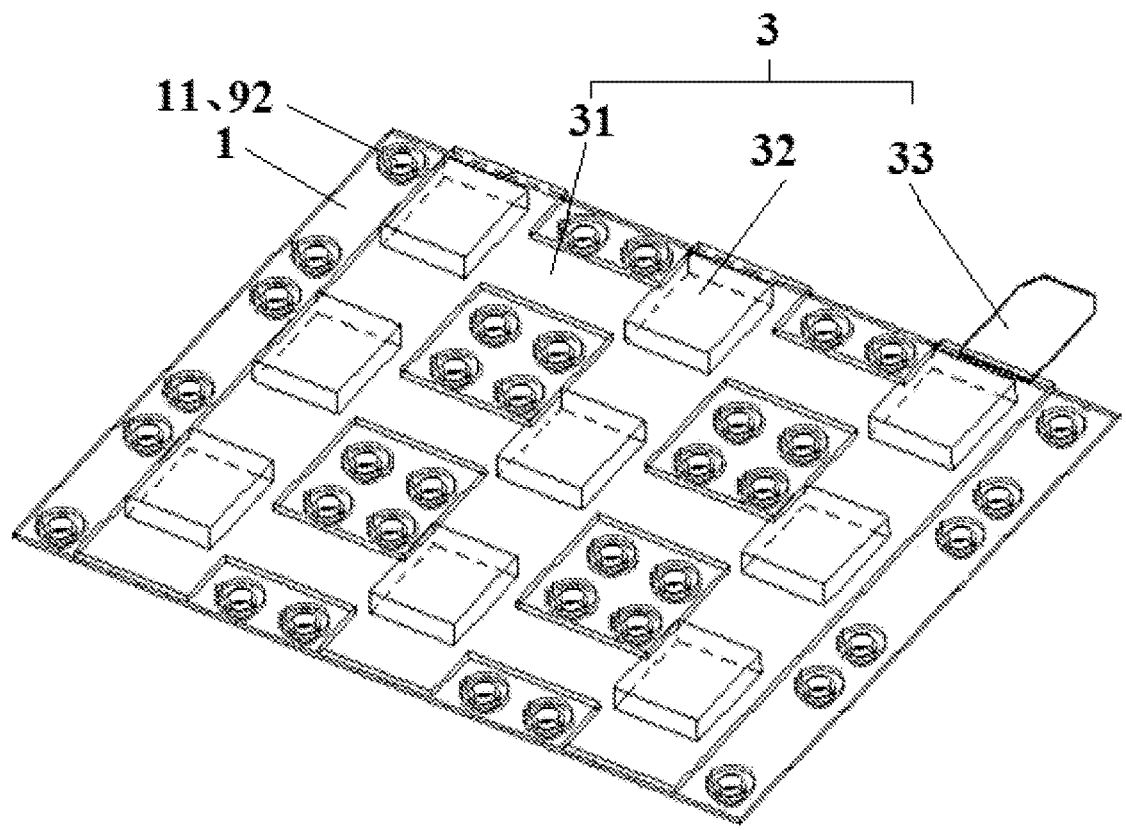
FIG. 5 is a schematic diagram of a structure of a positioning substrate and a second connection member, which have been assembled, of a display device according to an embodiment of the disclosure.
Figure 6:
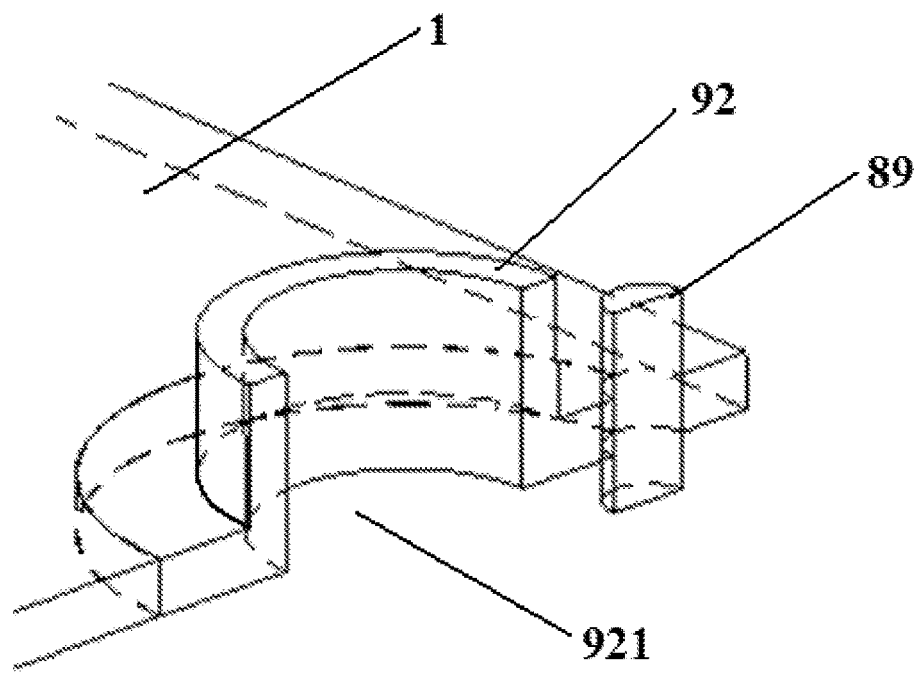
FIG. 6 is a schematic partial cross-sectional view of a structure of a positioning hole in FIG. 5.

Referring to FIGS. 4 and 5, a part of the circuit (i.e., the driving circuit 3) configured to provide driving signals to the display panel 2 may be provided on the positioning substrate 1. Of course, the driving circuit 3 needs to be electrically connected to the display panel 2, for example, is electrically connected to the display panel 2 through the panel flexible circuit board 42 (Panel-HUB FPC).

The specific structure of the driving circuit 3 may be set as required. For example, referring to FIGS. 4 and 5, the driving circuit 3 may include a connection board 31 (HUB) connected to the positioning substrate 1, and the connection board 31 (HUB) is mainly used to achieve bridge connection between different display panels 2 and is electrically connected to the panel flexible circuit board 42. The connection board 31 may also be connected to a plurality of additional components 32 configured to achieve required circuit functions, such as a DC-DC converter, a capacitor, an inductor, a switch and other devices. To introduce signals to the connection board 31, and a side surface of the connection board 31 may be connected to an external flexible circuit board 33 (external FPC) to be connected with an external signal source (e.g., a graphics card), a power supply, and the like.

The connection board 31, the additional components 32, the external flexible circuit board 33 and the like in the driving circuit 3 may be a one-piece structure, or may be assembled when needed. The driving circuit 3 may be directly formed as a one-piece structure together with the positioning substrate 1, or may be mounted on the positioning substrate 1 when needed.

In some embodiments, the driving circuit 3 is connected to a side of the positioning substrate 1 facing the display panel 2.

Figure 14:
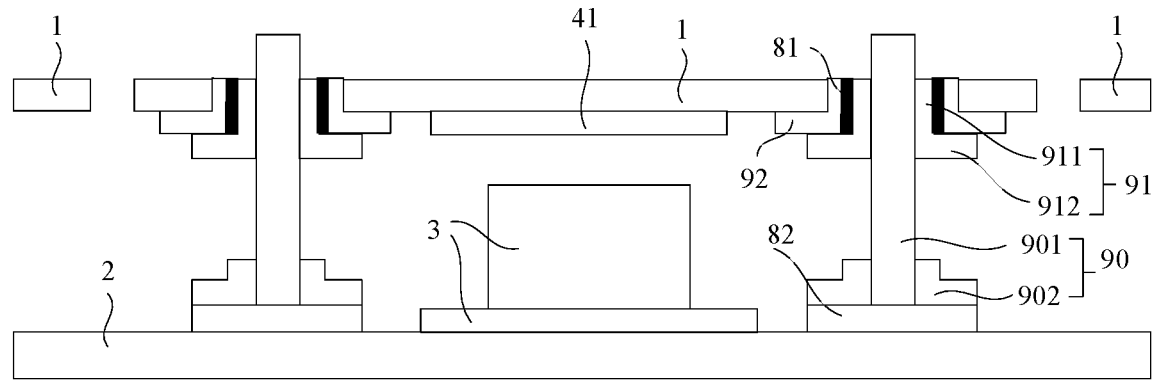
FIG. 14 is a schematic partial cross-sectional view of a structure of a display device according to an embodiment of the disclosure.

As an implementation of the embodiments of the present disclosure, referring to FIG. 14, the driving circuit 3 may be disposed on the side of the positioning substrate 1 facing the display panel 2, i.e., between the positioning substrate 1 and the display panel 2.

It can be seen that, according to the above implementation, there is no other structure between the driving circuit 3 and the display panel 2, which facilitates electrical connection between the driving circuit 3 and the display panel 2. For example, the driving circuit 3 and the display panel 2 are electrically connected through the panel flexible circuit board 42 (Panel-HUB FPC) disposed on the back side of the display panel 2.

In some embodiments, the driving circuit 3 is connected to a side of the positioning substrate 1 away from the display panel 2.

Figure 15:
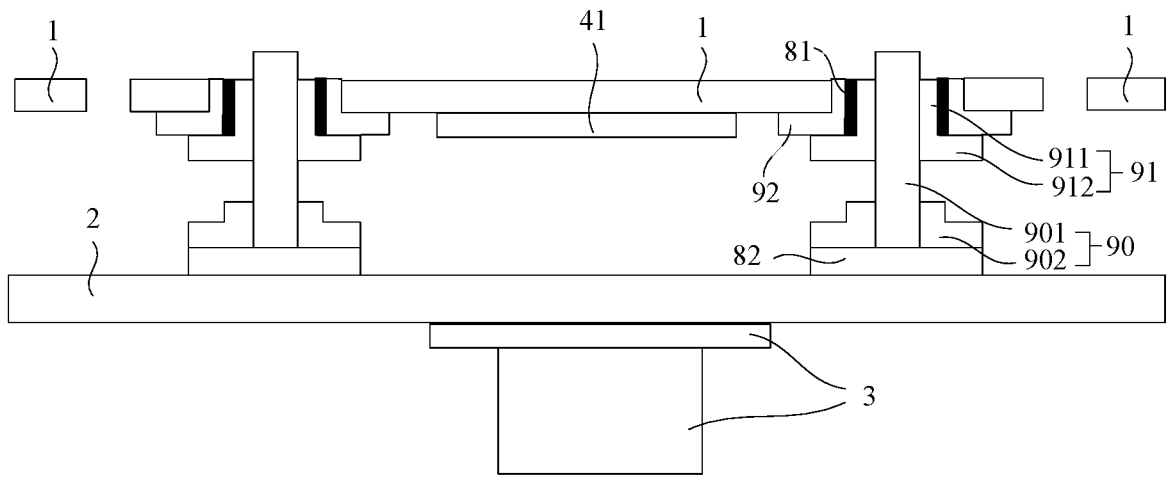
FIG. 15 is a schematic partial cross-sectional view of a structure of another display device according to an embodiment of the disclosure.

As another implementation of the embodiments of the present disclosure, referring to FIG. 15, the driving circuit 3 may be disposed on the side of the positioning substrate 1 away from the display panel 2.

It can be seen that, according to the above implementation, there may be no other structure or fewer other structures between the display panel 2 and the positioning substrate 1, and therefore, a distance between the display panel 2 and the positioning substrate 1 may be small, which is beneficial to reducing the overall thickness of the display device and improving stability of the connection between the display panel 2 and the positioning substrate 1.

In some embodiments, the display panel 2 is combined with at least one connection structure 9 to form a "display panel assembly". Then, a plurality of display panel assemblies may be connected to the positioning substrate 1 by bonding (of course, the display panels 2 are also connected to the positioning substrate 1) to obtain a display device.

As described above, each display panel assembly includes a display panel 2 and at least one connection structure 9 disposed on the back side of the display panel 2. Each connection structure 9 includes a fixing member 90 connected to the back side of the display panel 2, a first connection member 91 detachably connected to the fixing member 90, and a second connection member 92 configured to be detachably connected to the positioning substrate 1. The second connection member 92 is also configured to be bonded to the first connection member 91 through a first bonding structure 81, so as to fix the display panel 2 on the positioning substrate 1 by bonding.

"Detachable connection between A and B" means that A and B can be connected together in some way with fixed relative position; but when needed, A and B can be separated from each other and are no longer connected without damaging any structure; in other words, "detachable connection" is equivalent to a connection that allows repeated installation and removal.

Referring to FIGS. 7 to 13, each connection structure 9 includes a fixing member 90 connected to the back side of the display panel 2; the first connection member 91 is detachably connected to the fixing member 90; at the same time, another (the second) connection piece 92 is detachably connected to the positioning substrate 1. Thus, when the first connection member 91 and the second connection member 92 are bonded together, it is equivalent to that the display panel 2 is bonded onto the positioning substrate 1 by bonding.

In this case, the first connection member 91 and the second connection member 92 are connected by bonding, but the first connection member 91 and the second connection member 92 are detachably connected to the display panel 2 (through the fixing member 90) and the positioning substrate 1, respectively.

Therefore, when a certain display panel 2 in the display device needs to be detached (if replacement, maintenance, or adjustment is required), the first connection member 91 can be detached from the display panel 2 (the fixing member 90), and the second connection member 92 can be detached from the positioning substrate 1, so as to realize separation of the display panel 2 from the positioning substrate 1.

Then, when the display panel 2 needs to be connected to the positioning substrate 1 again (for example, after the maintenance of the display panel 2 is completed), the first connection member 91 and the second connection member 92 are replaced with a new first connection member 91 and a new second connection member 92, and then the display panel 2 and the positioning substrate 1 are connected again using the new first connection member 91 and the new second connection member 92.

Therefore, in the display device of the embodiments of the present disclosure, the disassembly and assembly of the display panel 2 (such as for replacement, maintenance, adjustment, etc.) can be realized by only replacing individual parts, and the maintenance is convenient and the cost is low.

Specifically, if there is a problem with a certain display panel 2, the plurality of second connection members 92 corresponding to the display panel 2 can all be detached from the positioning substrate 1, so that the display panel 2 as well as the corresponding fixing members 90, the first connection members 91 and the second connection members 92 can be separated from the positioning substrate 1; then the first connection member 91 and the second connection member 92 (connected by bonding) together are detached from the fixing member 90 and discarded, so as to obtain the display panel 2 with the fixing member 90, and an operation such as maintenance is performed on the display panel 2.

When maintenance of the display panel 2 is completed (or the display panel 2 is replaced with a new display panel 2), a new second connection member 92 may be connected to the positioning substrate 1, a new first connection member 91 may be connected to the fixing member 90 of the display panel 2, then an adhesive is applied between the first connection member 91 and the second connection member 92, and the display panel 2 is fixed on the positioning substrate 1 by bonding after the adhesive is cured.

It can be seen that, independent maintenance and replacement of the display panel 2 in the display device can be completed by only consuming tiny parts like the first connection member 91 and the second connection member 92.

In some embodiments, the first connection member 91 has a bonding portion 911 extending in a direction perpendicular to the display panel 2.

The second connection member 92 has a bonding hole 921 extending in the direction perpendicular to the display panel 2.

At least a part of the bonding portion 911 is used to be inserted into the bonding hole 921, and an outer surface of the bonding portion 911 inserted into the bonding hole 921 is used to be bonded to an inner surface of the bonding hole 921 through the first bonding structure 81. When the bonding portion 911 is inserted to a central position of the bonding hole 921, there is a gap between the outer surface of the bonding portion 911 and the inner surface of the bonding hole 921.

Figure 10:
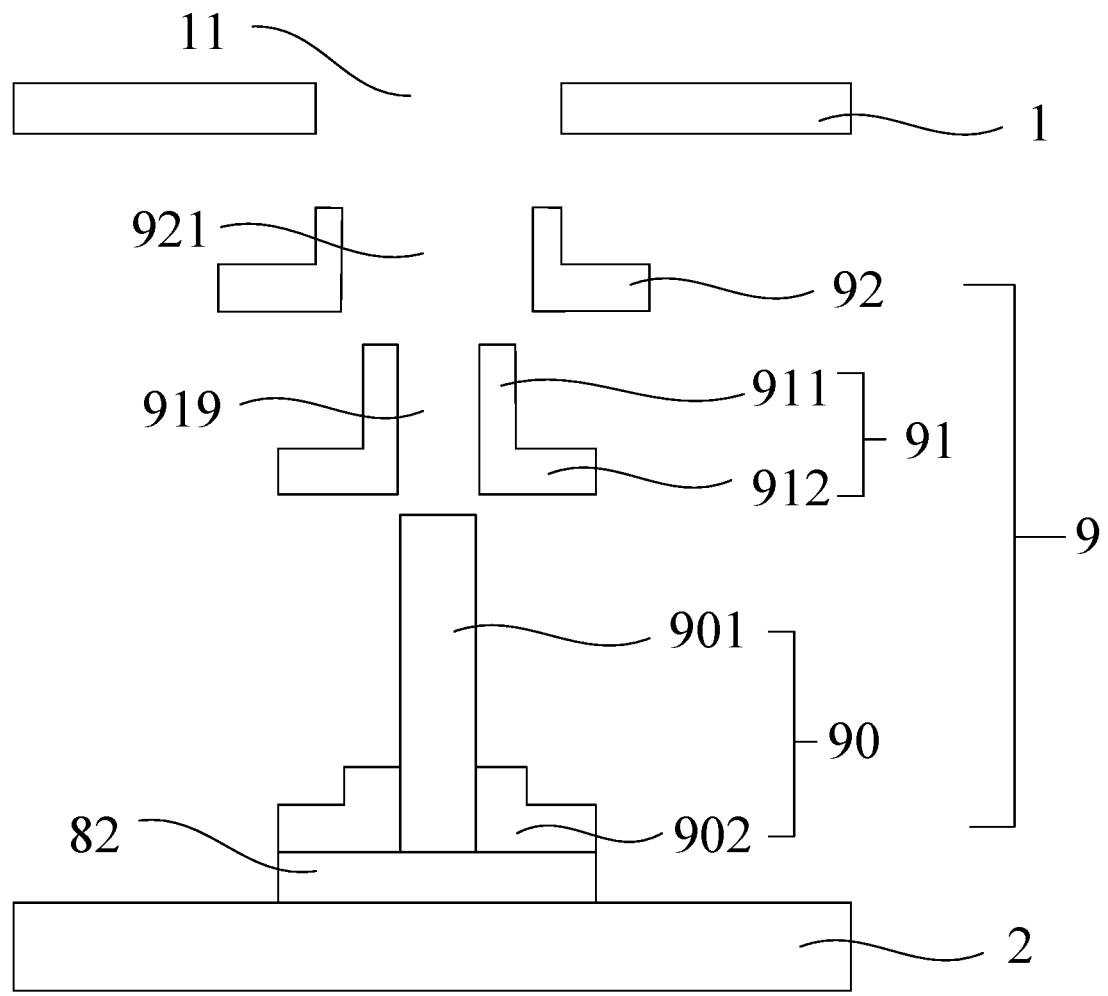
FIG. 10 is a schematic partial exploded cross-sectional view of a structure of a connection structure of a display device according to an embodiment of the disclosure.
Figure 11:
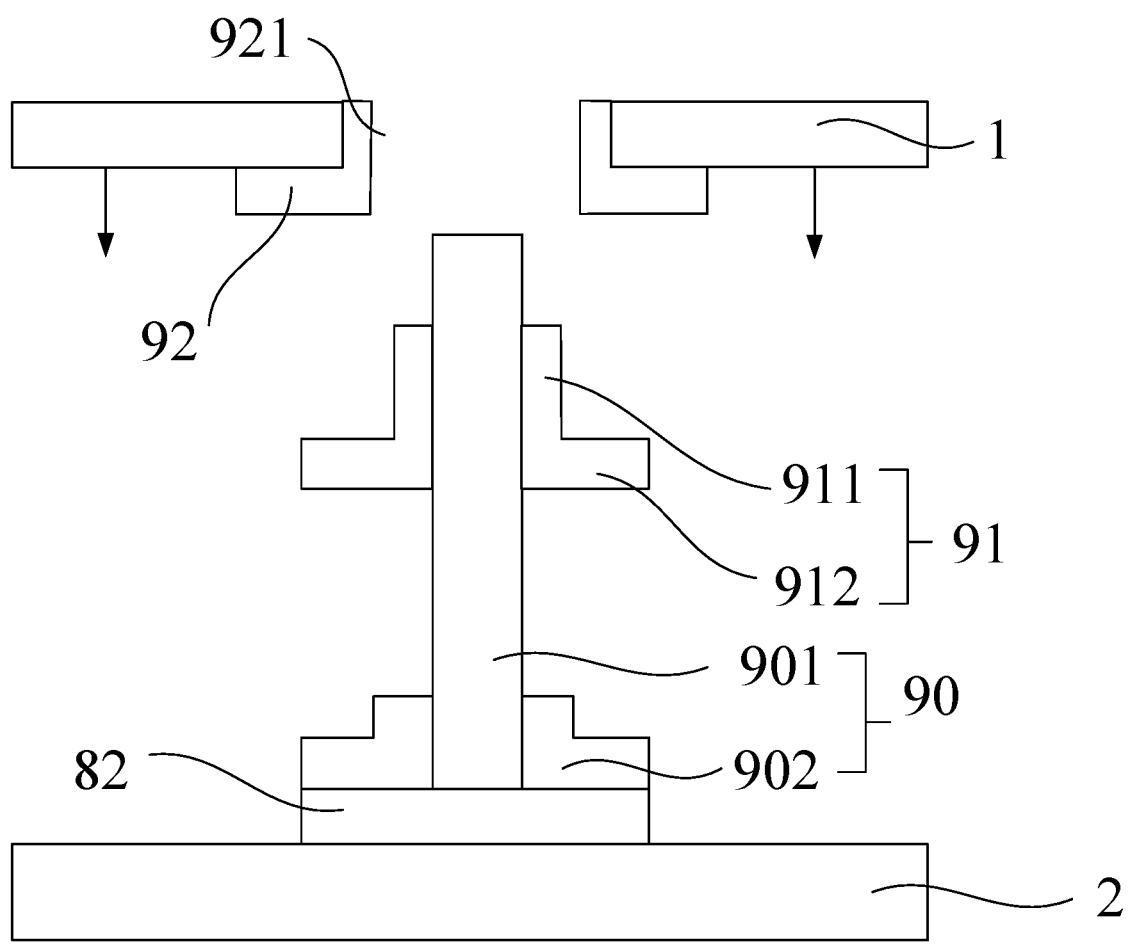
FIG. 11 is a schematic partial cross-sectional view of a structure of a connection structure of a display device before the display panel and the positioning substrate are aligned according to an embodiment of the disclosure.
Figure 12:
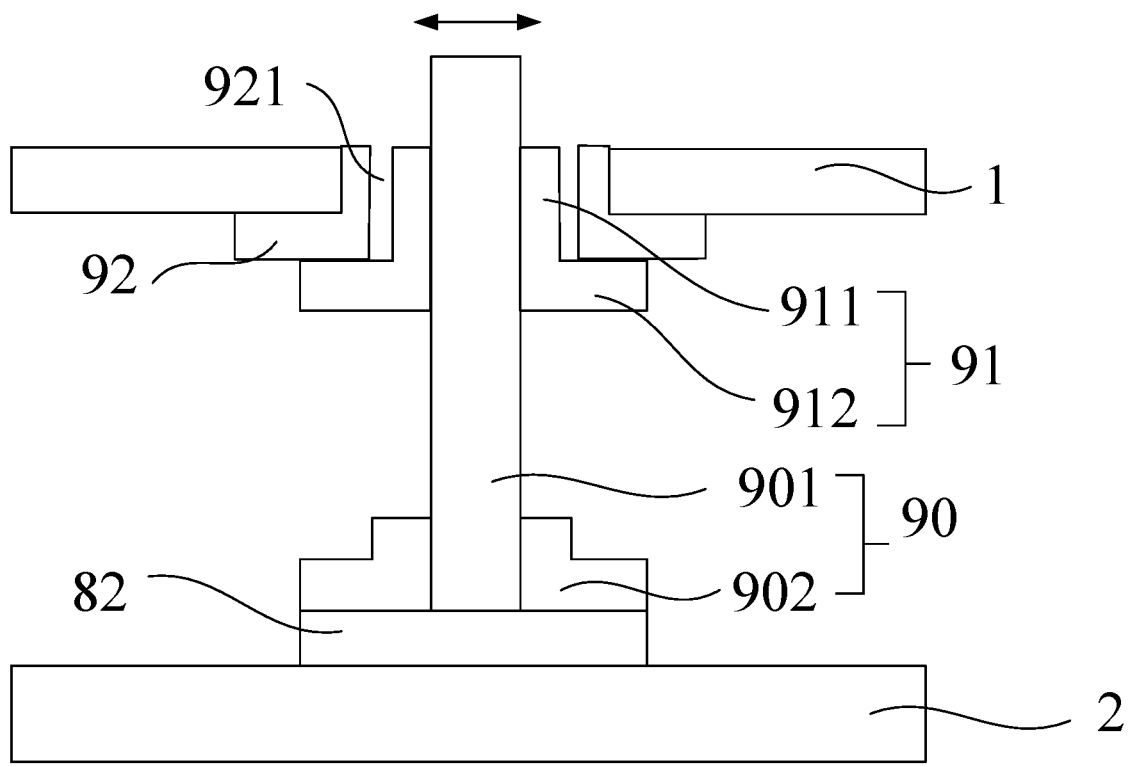
FIG. 12 is a schematic partial cross-sectional view of a structure of a connection structure of a display device before the display panel and the positioning substrate are bonded according to an embodiment of the disclosure.

Referring to FIGS. 10 to 12, as an implementation of the embodiments of the present disclosure, the bonding hole 921 may be provided in the second connection member 92, and the bonding portion 911 of the first connection member 91 may be inserted into the bonding hole 921, and is bonded in the bonding hole 921 through an adhesive.

Moreover, when the bonding portion 911 is inserted to the central position of the bonding hole 921, the outer surface of the bonding portion 911 and the inner surface of the bonding hole 921 are spaced apart from each other. In other words, an outer diameter of the bonding portion 911 is smaller than an inner diameter of the bonding hole 921, thus the bonding portion 911 can move in the bonding hole 921 in a direction parallel to the display panel 2 (or positioning substrate 1) (i.e., direction of a horizontal arrow in FIG. 12), and in turn the position of the display panel 2 relative to the positioning substrate 1 is adjusted. When the display panel 2 is adjusted to a proper position, the first bonding structure 81 may be formed by filling the gap between the outer surface of the bonding portion 911 and the inner surface of the bonding hole 921 with an adhesive to accurately position the display panel 2 at a desired position.

The bonding portion 911 and the bonding hole 921 may have various shapes, as long as it is ensured that the bonding portion 911 can move in the bonding hole 921 in the direction parallel to the display panel 2. However, from the viewpoint of convenience and uniformity, the bonding portion 911 and the bonding hole 921 may generally be cylindrical.

The size of the gap between the bonding portion 911 and the bonding hole 921 may be set according to needs of position adjustment, but usually it may be relatively large (e.g., greater than 3 mm). As such, on the one hand, it is easy for the bonding portion 911 to be inserted into the bonding hole 921, and on the other hand, a wider range of position adjustment is allowed.

In some embodiments, the bonding hole 921 is a through hole penetrating through the second connection member 92.

The second connection member 92 is configured to be detachably inserted into the positioning hole 11 penetrating through the positioning substrate 1.

The first connection member 91 has a connection hole 919 extending in the direction perpendicular to the display panel 2, and the connection hole 919 penetrates through the first connection member 91.

The fixing member 90 includes an insertion portion 901 extending in the direction perpendicular to the display panel 2, and a part of the insertion portion 901 is inserted into the connection hole 919 and is detachably connected to the first connection member 91.

Referring to FIGS. 4 and 10, the positioning substrate 1 has a positioning hole 11 penetrating therethrough in a thickness direction, and the second connection member 92 is inserted into the positioning hole 11 (that is, the outer surface is in contact with the positioning hole 11). Meanwhile, the bonding hole 921 of the second connection member 92 is a through hole, so that the bonding portion 911 of the first connection member 91 can "pass through" the second connection member 92. Further, the first connection member 91 also has a through connection hole 919, so that the insertion portion 901 of the fixing member 90 can also "pass through" the first connection member 91.

In this way, referring to FIG. 12, the final fixing member 90 (insertion portion 901) actually "passes through" the first connection member 91, the second connection member 92, and the positioning substrate 1 at the same time.

Figure 9:
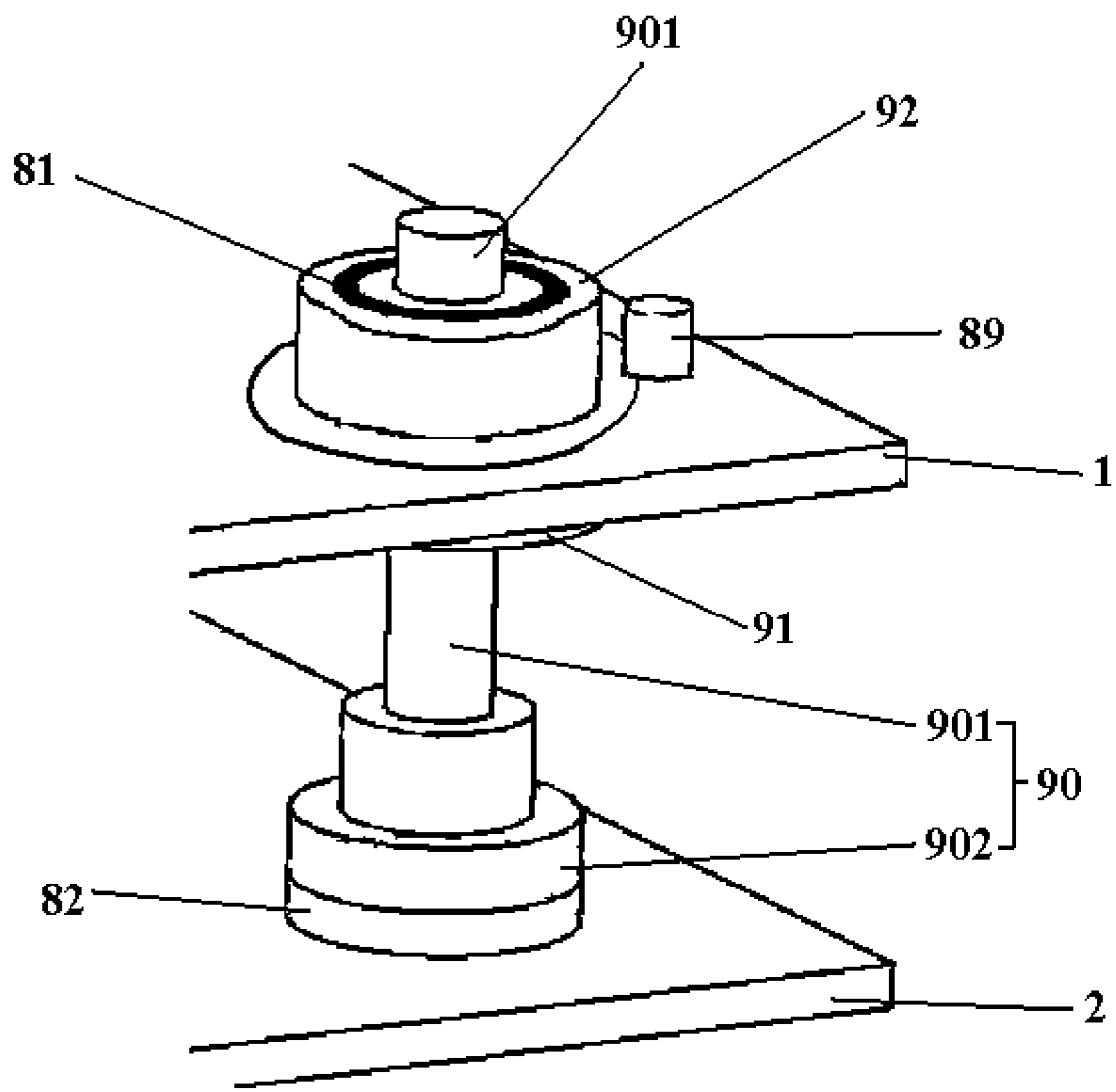
FIG. 9 is a schematic partial diagram of a structure of a connection structure of a display device according to an embodiment of the disclosure.
Figure 13:
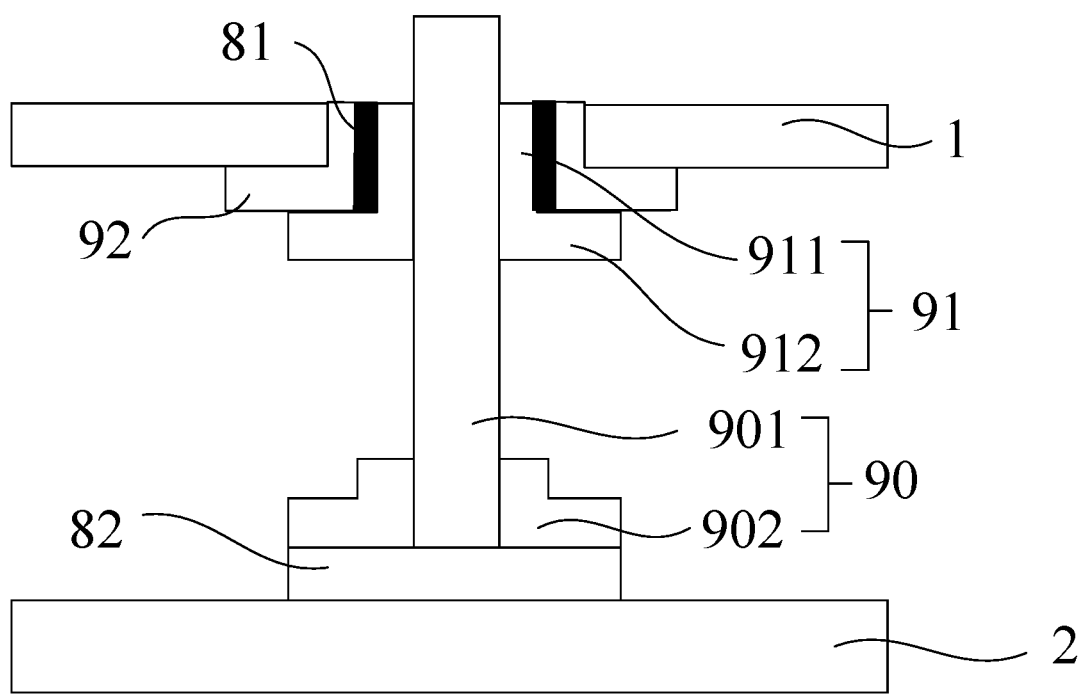
FIG. 13 is a schematic partial cross-sectional view of a structure of a connection structure of a display device according to an embodiment of the disclosure.

Thus, referring to FIGS. 9, 12, and 13, by connecting the first connection member 91 to different positions of the insertion portion 901 in the direction perpendicular to the positioning substrate 1 (or a height direction of the insertion portion 901), the display panel 2 is fixed at "different heights" of the insertion portion 901, so that a distance between the display panel 2 and the positioning substrate 1 can also be different.

In other words, with the above structure, the distance between the display panel 2 and the positioning substrate 1 can be adjusted, so that the structure of the display device is more flexible and adjustable.

In some embodiments, the second connection member 92 is configured to be clamped in the positioning hole 11 of the positioning substrate 1.

As an implementation of the embodiments of the present disclosure, the second connection member 92 may be provided in the positioning hole 11 by a snap-fit connection (the snap-fit connection is of course a detachable connection).

Since the second connection member 92 in the display device is connected to the first connection member 91, and the first connection member 91 is connected to the display panel 2 (e.g., through the fixing member 90), it is not easy to detach the first connection member 91 from the display panel 2 (the fixing member 90). Therefore, the second connection member 92 can be easily separated from the positioning substrate 1, so that the second connection member 92 can be detached from the display panel 2 first, and then be detached from the fixing member 90 together with the first connection member 91. The disassembly of a "snap-fit connection" is usually relatively simple and convenient.

Of course, the specific snap-fit connection between the second connection member 92 and the positioning hole 11 is implemented in various ways.

For example, referring to FIG. 12, one end of the second connection member 92 may enter the positioning hole 11, and a positioning pin 89 may be inserted into the gap between the second connection member 92 and the positioning hole 11, so that an outer surface of the second connection member 92 is in close contact with an inner surface of the positioning hole 11, and a relatively large pressure is generated to fix the second connection member 92; when disassembly is needed, once the positioning pin 89 is pulled out, the pressure between the outer surface of the second connection member 92 and the inner surface of the positioning hole 11 is reduced, and the second connection member 92 can be easily detached.

In some embodiments, the insertion portion 901 is a stud with an external thread; the inner surface of the connection hole 919 of the first connection member 91 has an internal thread matching the external thread, and the first connection member 91 and the insertion portion 901 are connected threadedly.

As the implementation of the embodiments of the present disclosure, the insertion portion 901 of the above fixing member 90 is a stud, and the inner surface of the connection hole 919 of the first connection member 91 has an internal thread (or the first connection member 91 is a "nut"), so that the first connection member 91 can be connected to the insertion portion 901 by threaded connection.

In this way, on the one hand, the detachable connection between the first connection member 91 and the fixing member 90 can be realized; on the other hand, the position (height) of the first connection member 91 relative to the insertion portion 901 (stud) can be accurately and stably adjusted by rotating the first connection member 91, the operation is easy, and the first connection member 91 can be stably fixed at any position of the insertion portion 901 in a height direction.

In some embodiments, the first connection member 91 further includes a limiting portion 912 connected to an end of the bonding portion 911 close to the display panel 2. In a plane parallel to the display panel 2, a dimension of an outer edge of the limiting portion 912 in at least one direction is larger than a diameter of the bonding hole 921 in this direction to prevent the limiting portion 912 from entering the bonding hole 921.

Referring to FIGS. 8 and 10 to 12, an end of the first connection member 91 close to the display panel 2 may be provided with a limiting portion 912 having a dimension larger than (or protruding outward from) the bonding portion 911. The dimension of the limiting portion 912 is larger than that of the bonding hole 921 in at least part of directions. For example, the limiting portion 912 may be a ring-like plate whose outer diameter is larger than the diameter of the bonding hole 921 (the hole in the ring-like plate is the connection hole 919).

As a result, the limiting portion 912 will be "stuck" outside the bonding hole 921 and cannot enter the bonding hole 921, ensuring that the relative position between the first connection member 91 and the second connection member 92 is accurate.

For example, before the adhesive between the bonding portion 911 and the bonding hole 921 is cured to form the first bonding structure 81, the second connection member 92 can be "carried" on the limiting portion 912, so that a desired relative position can be maintained between the second connection member 92 and the first connection member 91 (i.e., between the positioning substrate 1 and the display panel 2).

Of course, it should be understood that the above forms of the fixing member 90, the first connection member 91, the second connection member 92, and the like are only exemplary, and are not intended to limit the feasible scope of the embodiments of the present disclosure.

For example, the first connection member 91 may also be connected to the top end of the fixing member 90 (i.e., an end away from the display panel 2) by snap-fit or other means, and there is no through hole in the first connection member 91. The second connection member 92 may also be connected to the side of the positioning substrate 1 facing the display panel 2 by snap-fit or other means, and there is no through hole in the second connection member 92. In this way, the first connection member 91 and the second connection member 92 will have opposite surfaces, so that an adhesive is applied between the two opposite surfaces to form the first bonding structure 81 to bond the first connection member 91 to the second connection member 92 (that is, the positioning substrate 1 and the display panel 2 are connected by bonding).

In some embodiments, the first connection member 91 and the second connection member 92 are made of a plastic material.

When the display panel 2 needs to be removed from the display device, components that actually need to be replaced (discarded) are only the first connection member 91 and the second connection member 92, and the display panel 2, the fixing member 90, and the like can continue to be used. Therefore, the first connection member 91 and second connection member 92 are disposable and replaceable, and thus they may be made of low-cost plastic materials (e.g., engineering plastics) to reduce maintenance costs and avoid waste.

On the other hand, the positioning accuracy between the positioning substrate 1 and the display panel 2 is determined by the positioning accuracy of the positioning substrate 1 during bonding, but not necessarily related to the dimensional accuracies of the first connection member 91 and the second connection member 92. Therefore, the first connection member 91 and the second connection member 92 may be made of plastic materials with relatively low strength and low precision (e.g., engineering plastics).

Of course, the first connection member 91 and the second connection member 92 may be made of other materials such as metal; and other components, such as the fixing member 90, in the connection structure 9 may also be made of metal, plastic or the like.

In this way, in the display device of the embodiments of the present disclosure, many devices are standard parts of metal, plastic, and the like, rather than special parts, which can further reduce costs and facilitate industrialization.

In some embodiments, the fixing member 90 is bonded to the back side of the display panel 2.

As an implementation of the embodiments of the present disclosure, the fixing member 90 may also be connected to the back side of the display panel 2 by bonding.

For example, referring to FIGS. 9 to 12, one end of the insertion portion 901 (stud) of the fixing member 90 may be inserted into a hole (e.g., a threaded hole) in a base portion 902, and the base portion 902 is then bonded to the back side of the display panel 2 (of course, at a position where no structure such as the panel circuit board 41 is located) through an additional bonding structure 82 formed by an adhesive (e.g., hot melt adhesive, thermosetting adhesive, ultraviolet curing adhesive, etc.). The base portion 902 has a larger contact area as compared with the insertion portion 901, which can ensure more stable bonding of the fixing member 90.

Of course, it is also feasible if the fixing member 90 is bonded to the back side of the display panel 2 by other means (for example, the insertion portion 901 is directly bonded to the back side of the display panel 2).

Alternatively, it is also feasible if the fixing member 90 is connected to the back side of the display panel 2 by other non-bonding means (such as snap-fit, welding, threaded connection, etc.).

Alternatively, the fixing member 90 and the back side of the display panel 2 may be originally a one-piece structure. For example, the fixing member 90 is a stud directly protruding from the back side of the display panel 2, and thus the fixing member 90 is no longer a separate device.

In short, it is only required that the fixing member 90 can be connected to the back side of the display panel 2 in the display panel assembly, regardless of whether it is a separate device mounted on the display panel 2 or a part of the display panel 2.

In some embodiments, each display panel 2 corresponds to at least three connection structures 9, and positions of at least three connection structures 9 on the back side of the display panel 2 are not collinear.

That is, referring to FIG. 7, each display panel assembly should be provided with three or more connection structures 9. Moreover, among all the connection structures 9, at least three connection structures 9 are connected to positions of the back side of the display panel 2 that are not collinear. In this way, the plurality of connection structures 9 corresponding to each display panel 2 can define a plane, so that the display panel 2 can be fixed more stably.

For example, referring to FIG. 7, each display panel 2 may be substantially in the shape of a rectangle, and each of four corners of the rectangle is provided with more than one connection structure 9.

In some embodiments, the display device further includes a fine adjustment structure disposed between the display panel 2 and the positioning substrate 1, and the fine adjustment structure includes:
  a fine adjustment platform 51 connected to the back side of the display panel 2; and
  a fine adjustment bracket 52 connected to a side of the fine adjustment platform away from the display panel 2 and being movable relative to the positioning substrate 1 in a plane parallel to the positioning substrate 1.

Figure 16:
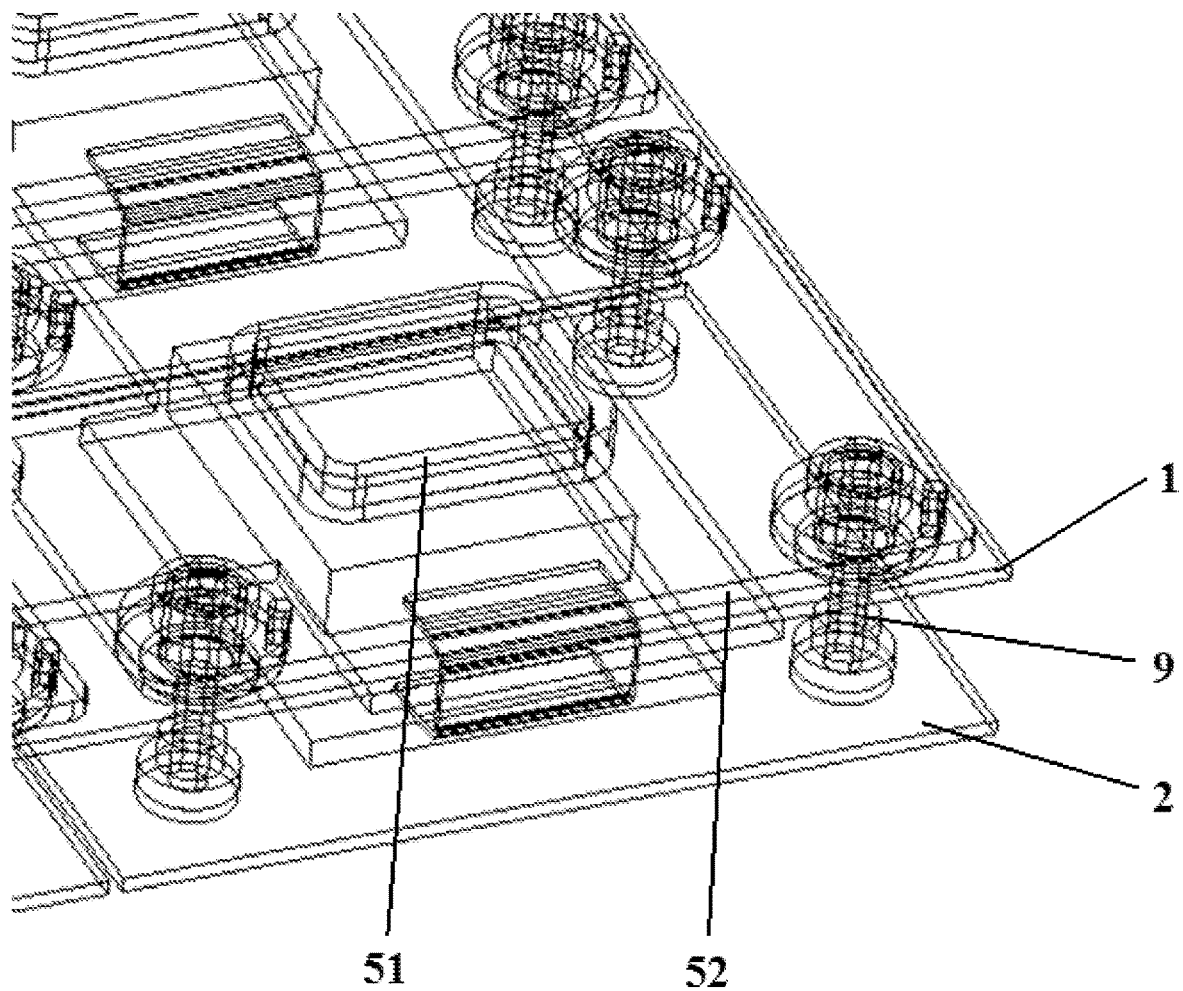
FIG. 16 is a partial perspective view of a structure of another display device according to an embodiment of the disclosure.

Referring to FIG. 16, in an assembled display device, the position of the display panel 2 may slightly deviate from the desired position, so a fine adjustment structure may be provided. The fine adjustment platform 51 in the fine adjustment structure is connected to the back side of the display panel 2 and connected to the fine adjustment bracket 52. The fine adjustment bracket 52 may move in a plane parallel to the positioning substrate 1, for example, the fine adjustment bracket 52 may be connected to the positioning substrate 1 through a structure such as a guide rail (not shown in the figures).

Therefore, by adjusting the position of the fine adjustment bracket 52, the fixing member 90 can be slightly inclined, and the position (in the plane parallel to the positioning substrate 1) of the display panel 2 can be adjusted within a relatively small range.

In some embodiments, the display device includes:
  a plurality of display panels 2; each display panel 2 having a display side and a back side opposite to each other;
  a positioning substrate 1 arranged on the back side of the display panel 2;
  a plurality of connection structures 3, each display panel 2 corresponding to at least one connection structure 9, and the display panel 2 being fixed on the positioning substrate 1 by bonding through the at least one connection structure 9 corresponding thereto;
  wherein each connection structure 9 includes:
    a fixing member 90 connected to the back side of the display panel 2;
    a first connection member 91 detachably connected to the fixing member 90; and
    a second connection member 92 detachably connected to the positioning substrate 1, the second connection member 92 being bonded to the first connection member 91 through a first bonding structure 81 so that the display panel 2 is fixed on the positioning substrate 1 by bonding.

In some embodiments, the first connection member 91 has a bonding portion 911 extending in a direction perpendicular to the display panel 2;
  the second connection member 92 has a bonding hole 921 extending in the direction perpendicular to the display panel 2;
  at least a part of the bonding portion 911 is inserted into the bonding hole 921, and an outer surface of the bonding portion 911 inserted into the bonding hole 921 is bonded to an inner surface of the bonding hole 921 through the first bonding structure 81; and when the bonding portion 911 is inserted to the central position of the bonding hole 921, there is a gap between the outer surface of the bonding portion 911 and the inner surface of the bonding hole 921.

In some embodiments, the bonding hole 921 is a through hole penetrating through the second connection member 92.

The second connection member 92 is detachably inserted into the positioning hole 11 penetrating through the positioning substrate 1.

The first connection member 91 has a connection hole 919 extending in a direction perpendicular to the display panel 2, and the connection hole 919 penetrates through the first connection member 91.

The fixing member 90 includes an insertion portion 901 extending in the direction perpendicular to the display panel 2, and a part of the insertion portion 901 is inserted into the connection hole 919 and detachably connected to the first connection member 91.

In some embodiments, the insertion portion 901 is a stud with an external thread.

An inner surface of the connection hole 919 of the first connection member 91 has an internal thread matching the external thread, and the first connection member 91 and the insertion portion 901 are in threaded connection.

In some embodiments, the second connection member 92 is clamped in the positioning hole 11 of the positioning substrate 1.

In some embodiments, the first connection member 91 further includes a limiting portion 912 connected to an end of the bonding portion 911 close to the display panel 2.

In a plane parallel to the display panel 2, a dimension of an outer edge of the limiting portion 912 in at least one direction is larger than a diameter of the bonding hole 921 in this direction, so as to prevent the limiting portion 912 from entering the bonding hole 921.

In some embodiments, the first connection member 91 and the second connection member 92 are made of plastic materials.

In some embodiments, the fixing member 90 is bonded to the back side of the display panel 2.

In some embodiments, each display panel 2 corresponds to at least three connection structures 9, and positions of at least three connection structures 9 on the back side of the display panel 2 are not collinear.

In some embodiments, the positioning substrate 1 is connected with a driving circuit 3 configured to provide a driving signal to the display panel 2, and the driving circuit 3 is electrically connected to the display panel 2.

In some embodiments, the driving circuit 3 is connected to a side of the positioning substrate 1 facing the display panel 2; or the driving circuit 3 is connected to the side of the positioning substrate 1 away from the display panel 2.

In some embodiments, the display device further includes a fine adjustment structure provided between the display panel 2 and the positioning substrate 1, and the fine adjustment structure includes:

a fine adjustment platform 51 connected to the back side of the display panel 2; and a fine adjustment bracket 52 connected to a side of the fine adjustment platform away from the display panel 2 and being movable relative to the positioning substrate 1 in a plane parallel to the positioning substrate 1.

In some embodiments, the display panel 2 is a light-emitting diode display panel.

The light-emitting diode display panel includes a substrate and a plurality of light-emitting diodes connected to the substrate.

In some embodiments, the light-emitting diode is a Micro-LED or a Mini-LED.

It should be understood that the display device formed by the display panel assembly may also have other auxiliary structures, such as an encapsulation member (or a housing) that seals the side surfaces and back sides of the positioning substrate 1 and the display panel 2 to achieve functions such as dustproof and aesthetic.

In some embodiments, the back side of the display panel 2 is bonded to the positioning substrate 1 through a second bonding structure 83.

Figure 17:
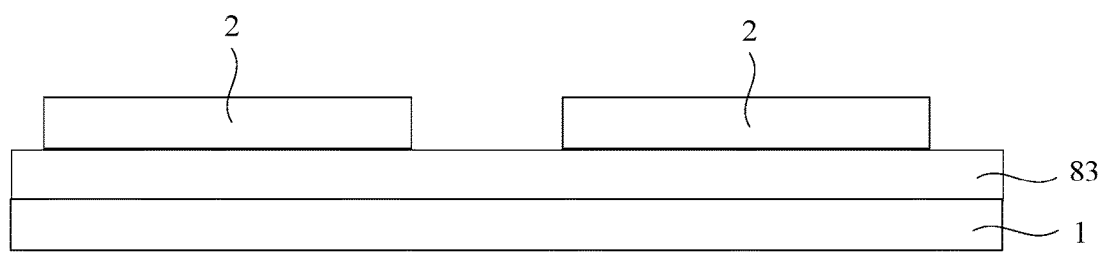
FIG. 17 is a schematic partial cross-sectional view of a structure of another display device according to an embodiment of the disclosure.

Referring to FIG. 17, as another implementation of the embodiments of the present disclosure, an adhesive (e.g., an OCA film) may be directly arranged between the back side of the display panel 2 and the positioning substrate 1, the adhesive is cured to form the second bonding structure 83, and the display panel 2 is bonded to the positioning substrate 1 through the second bonding structure 83.

It can be seen that in the above implementation, the display panel 2 and the positioning substrate 1 are directly bonded, and no other device needs to be provided. Therefore, the display device is simple in structure, easy to manufacture, and low in cost.

In a second aspect, embodiments of the present disclosure provide a manufacturing method of a display device.

The method of the embodiments of the present disclosure is used to manufacture (or assemble) the above display device.

Referring to FIGS. 1 to 18, the manufacturing method of the display device of the embodiment of the present disclosure includes steps as below.

In S201, a positioning substrate 1 and a plurality of display panels 2 are provided; each display panel 2 has a display side and a back side opposite to each other, and the back side of each display panel 2 is connected to the fixing member 90 of at least one connection structure 9.

In S202, the first connection member 91 of the connection structure 9 is detachably connected to the fixing member 90, and the second connection member 92 of the connection structure 9 is detachably connected to the positioning substrate 1.

In S203, the plurality of display panels 2 are arranged at predetermined positions.

In S204, a first bonding structure 81 is formed between the first connection member 91 and the second connection member 92, and the first connection member 91 and the second connection member 92 are bonded, so that the display panel 2 is fixed on the positioning substrate 1 by bonding; the positioning substrate 1 is arranged to face the back side of the display panel 2.

In the embodiments of the present disclosure, the positioning substrate 1 and the plurality of display panels 2 are prepared first, and the first connection member 91 and the second connection member 92 are connected to the display panel 2 (fixing member 90) and the positioning substrate 1, respectively. Then, the plurality of display panels 2 can be arranged at predetermined positions, that is, the respective positions of the display panels 2 are caused to be their positions required in the display device. Thereinafter, under the current predetermined positions, a first bonding structure 81 is formed to bond the display panel 2 and the positioning substrate 1 (specifically, the first connection member 91 and the second connection member 92 are bonded) to obtain the display device (or splice the display panels 2 together), so that the display panels 2 in the display device are all at the required positions accurately, the positioning accuracy is high, and the display effect is good.

Of course, it should be understood that when a screen with a larger area is required, a plurality of display devices may be further spliced together to form a display system, which is not described in detail here.

In some embodiments, arranging the plurality of display panels 2 at the predetermined positions includes: acquiring a current image including the plurality of display panels 2, analyzing the current image to determine the current positions of the plurality of display panels 2, and adjusting, according to a difference between the current position and the predetermined position, the position of the corresponding display panel 2.

That is to say, an image (current image) of the display panels 2 can be acquired by an image acquisition device such as a CCD camera, the current position of each display panel 2 can be determined by analyzing the current image, and then the display panel 2 is adjusted according to the difference between the current position and the desired position of the display panel 2, so as to accurately position each display panel 2 at the desired position Specific steps such as the step of positioning the display panel 2 and the step of bonding the display panel 2 to the positioning substrate 1 may be implemented by existing technological means. For example, an exemplary method for manufacturing a display device may include the following steps.

In S211, a driving circuit 3 is connected to a side of the positioning substrate 1 facing the display panel 2, and the second connection member 92 is connected to the positioning substrate 1.

For example, a connection board 31 (HUB) may be connected onto the positioning substrate 1, additional components 32 may be mounted on the connection board 31, and an external flexible circuit board 33 (external FPC) may be connected to the connection board 31.

In addition, the second connection member 92 is snap-fit connected to the positioning hole 11 of the positioning substrate 1, and then a positioning pin 89 is clipped to better fix the second connection member 92, and the structure with reference to FIG. 5 is obtained.

In S212, each device is mounted on the display panel 2 (of course, the plurality of display panels 2).

For example, a panel circuit board 41 (Panel PCB) is connected to the back side of the display panel 2 and a panel flexible circuit board 42 (Panel-HUB FPC) is connected to the panel circuit board 41.

In addition, the fixing member 90 is connected to the back side of the display panel 2, and the first connection member 91 is connected at a suitable height of the fixing member 90. For example, an insertion portion 901 of the fixing member 90 is inserted into a base portion 902, and then the base portion 902 is bonded to the back side of the display panel 2 by a hot melt adhesive or thermosetting adhesive, and then the first connection member 91 is rotated to be positioned at an appropriate height of the insertion portion 901 (stud), obtaining the structures with reference to FIG. 7.

In S213, a plurality of display panels 2 are arranged at predetermined positions.

Figure 18:
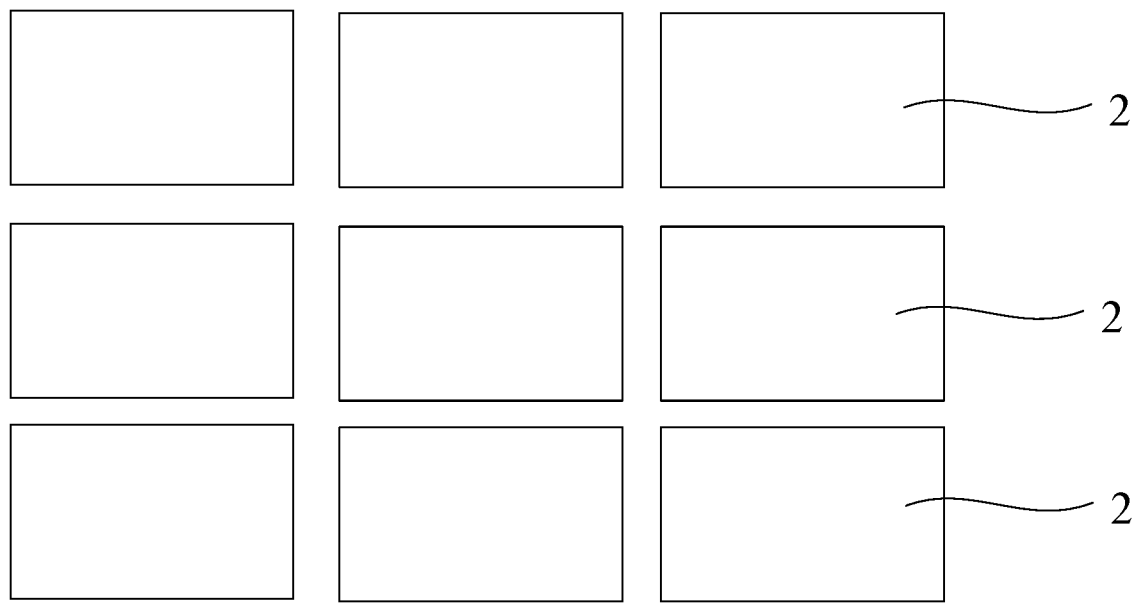
FIG. 18 is a schematic top view of a structure after positioning of each display panel is completed in another manufacturing method of a display device according to an embodiment of the disclosure.

For example, a numerical control assembly machine with a vacuum platform may be used to position and arrange the plurality of (e.g., nine) display panels 2 according to an image acquired by a CCD camera, and invert them on the vacuum platform uniformly to obtain the structure of FIG. 18.

Here, all the display panels 2 are in a same plane, the display sides thereof all face a same side, and the dimensional accuracy of gaps between the display panels 2 exceeds ±0.01 mm.

In S214, the positioning substrate 1 is aligned with the display panel 2.

For example, the positioning substrate 1 is turned 180 degrees to face the back side of each display panel 2, and each first connection member 91 on the display panel 2 is inserted into the bonding hole 921 of the second connection member 92 on the positioning substrate 1.

Because the size of the bonding hole 921 is much larger than (e.g., 3 mm larger than) the outer diameter of the first connection member 91, the above "inserting" process is easy to implement.

Of course, if necessary, connections of some other devices can also be completed in this step. For example, the panel flexible circuit board 42 (Panel-HUB FPC) on each display panel 2 can be connected (electrically connected) to the connection board 31 (HUB) on the positioning substrate 1.

In S215, the positioning substrate 1 and the display panel 2 are bonded.

For example, the gap between the outer surface of the second connection member 92 and the inner surface of the bonding hole 921 is injected with an adhesive (e.g., hot melt adhesive, thermosetting adhesive, ultraviolet curing adhesive), and then an appropriate condition (e.g., cooling, heating, UV radiation, etc.) is applied to cure the adhesive to form the first bonding structure 81. For thermosetting adhesive, it can be cured by heating; for ultraviolet curing adhesive (UV adhesive), it can be cured by ultraviolet radiation; while for hot melt adhesive, it needs to be injected after heating and is then cured after cooling.

To this point, the plurality of display panels 2 are bonded onto the positioning substrate 1 to obtain the display device with reference to FIG. 2.

It should be understood that the order in which the steps are described in the above embodiments is not an inevitable limitation on the execution order of the steps of the method of the embodiments of the present disclosure. For example, there is no inevitable order between the above steps S211 and S212. Any one of the two steps can be performed first, or both can be performed simultaneously.

In a case where the positioning substrate 1 and the display panel 2 are bonded by other means, the specific process can be adjusted accordingly.

For example, when the positioning substrate 1 and the display panel 2 are directly bonded, a large area of adhesive layer (e.g., an OCA film) may be attached to the positioning substrate 1, and then each display panel 2 is disposed at a predetermined position, and then the OCA film on the positioning substrate 1 comes into contact with the back side of the display panel 2, and the display panel 2 is bonded to the positioning substrate 1 through the second bonding structure 83 (OCA film) to obtain the display device with reference to FIG. 1.

The present disclosure has disclosed exemplary embodiments, and although specific terms are adopted, they are only used and should only be interpreted as general descriptive meanings, and are not used for the purpose of limitation. In some embodiments, it is obvious to those of ordinary skill in the art that, unless clearly indicated otherwise, the features, characteristics, and/or elements described in conjunction with a specific embodiment may be used alone, or combined with the features, characteristics, and/or elements described in conjunction with other embodiments. Therefore, those of ordinary skill in the art will understand that various changes in forms and details can be made without departing from the scope of the present disclosure as set forth by the appended claims.

The invention claimed is:

1. A display device, comprising:
    a plurality of display panels each having a display side and a back side opposite to each other;
    a positioning substrate arranged facing the back side of the display panel; and
    a plurality of connection structures, each of the plurality of display panels corresponding to at least one connection structure and being fixed on the positioning substrate by bonding through the at least one connection structure corresponding thereto;
    wherein each of the plurality of connection structures comprises:
    a fixing member connected to the back side of the display panel;
    a first connection member detachably connected to the fixing member; and
    a second connection member detachably connected to the positioning substrate, and configured to be bonded to the first connection member through a first bonding structure, so that the display panel is fixed on the positioning substrate by bonding,
    wherein the first connection member has a bonding portion extending in a direction perpendicular to the display panel;
    the second connection member has a bonding hole extending in the direction perpendicular to the display panel; and
    at least a part of the bonding portion is inserted into the bonding hole, an outer surface of the bonding portion inserted into the bonding hole is bonded to an inner surface of the bonding hole through the first bonding structure; and when the bonding portion is inserted to a central position of the bonding hole, there is a gap between the outer surface of the bonding portion and the inner surface of the bonding hole, wherein the bonding hole is a through hole penetrating through the second connection member;

the second connection member is detachably inserted in a positioning hole penetrating through the positioning substrate;

the first connection member has a connection hole extending in the direction perpendicular to the display panel, and the connection hole penetrates through the first connection member; and the fixing member comprises an insertion portion extending in the direction perpendicular to the display panel, and a part of the insertion portion is inserted into the connection hole and is detachably connected to the first connection member.

2. The display device of claim 1, wherein
the insertion portion is a stud with an external thread; and
an inner surface of the connection hole of the first connection member has an internal thread matching the external thread, and the first connection member is threadedly connected with the insertion portion.

3. The display device of claim 1, wherein
the second connection member is clamped in the positioning hole of the positioning substrate.

4. The display device of claim 1, wherein
the first connection member further comprises a limiting portion connected to an end of the bonding portion close to the display panel; and
in a plane parallel to the display panel, a dimension of an outer edge of the limiting portion in at least one direction is larger than a diameter of the bonding hole in this direction, so as to prevent the limiting portion from entering the bonding hole.

5. The display device of claim 1, wherein
the first connection member and the second connection member are made of a plastic material.

6. The display device of claim 1, wherein
the fixing member is bonded to the back side of the display panel through an additional bonding structure formed by an adhesive.

7. The display device of claim 1, wherein
each display panel corresponds to at least three connection structures, and among the at least three connection structures positions of three connection structures on the back side of the display panel are not collinear.

8. The display device of claim 1, wherein
a driving circuit configured to provide a driving signal to the display panel is connected to the positioning substrate, and the driving circuit is electrically connected to the display panel.

9. The display device of claim 8, wherein
the driving circuit is connected to a side of the positioning substrate facing the display panel;
or,
the driving circuit is connected to a side of the positioning substrate away from the display panel.

10. The display device of claim 1, further comprising a fine adjustment structure between the display panel and the positioning substrate, and the fine adjustment structure comprising:
a fine adjustment platform connected to the back side of the display panel; and a fine adjustment bracket connected to a side of the fine adjustment platform away from the display panel, the fine adjustment bracket being movable relative to the positioning substrate in a plane parallel to the positioning substrate.

11. The display device of claim 1, wherein
the display panel is a light-emitting diode display panel; and
the light-emitting diode display panel comprises a substrate and a plurality of light-emitting diodes connected to the substrate.

12. The display device of claim 11, wherein
the plurality of light-emitting diodes are Micro-LEDs or Mini-LEDs.

13. The display device of claim 1, wherein one end of the second connection member is in the positioning hole, and a positioning pin is inserted into a gap between the second connection member and the positioning hole, so that an outer surface of the second connection member is in close contact with an inner surface of the positioning hole, and a relatively large pressure is generated to fix the second connection member.

14. A manufacturing method of a display device, comprising:
providing a positioning substrate and a plurality of display panels; each of the plurality of display panels having a display side and a back side opposite to each other, and the back side being connected to a fixing member of at least one connection structure;
detachably connecting a first connection member of the connection structure to the fixing member, and detachably connecting a second connection member of the connection structure to the positioning substrate;
arranging the plurality of display panels at predetermined positions; and
forming a first bonding structure between the first connection member and the second connection member to bond the first connection member with the second connection member, so that the display panel is fixed on the positioning substrate by bonding; the positioning substrate being arranged to face the back side of the display panel,
wherein the first connection member has a bonding portion extending in a direction perpendicular to the display panel;
the second connection member has a bonding hole extending in the direction perpendicular to the display panel; and
at least a part of the bonding portion is inserted into the bonding hole, an outer surface of the bonding portion inserted into the bonding hole is bonded to an inner surface of the bonding hole through the first bonding structure; and when the bonding portion is inserted to a central position of the bonding hole, there is a gap between the outer surface of the bonding portion and the inner surface of the bonding hole,
wherein the bonding hole is a through hole penetrating through the second connection member;
the second connection member is detachably inserted in a positioning hole penetrating through the positioning substrate;
the first connection member has a connection hole extending in the direction perpendicular to the display panel, and the connection hole penetrates through the first connection member; and
the fixing member comprises an insertion portion extending in the direction perpendicular to the display panel, and a part of the insertion portion is inserted into the connection hole and is detachably connected to the first connection member.

15. The manufacturing method of claim 14, wherein arranging the plurality of display panels at predetermined positions comprises:
    acquiring a current image comprising the plurality of display panels, analyzing the current image to determine a current position of each display panel, and adjusting a position of the display panel according to a difference between the current position and the predetermined position of the display panel.

16. The manufacturing method of claim 14, wherein one end of the second connection member is in the positioning hole, and a positioning pin is inserted into a gap between the second connection member and the positioning hole, so that an outer surface of the second connection member is in close contact with an inner surface of the positioning hole, and a relatively large pressure is generated to fix the second connection member.

\* \* \* \* \*